(12) United States Patent
Oishi et al.

(10) Patent No.: US 11,461,647 B2
(45) Date of Patent: Oct. 4, 2022

(54) METHOD OF CONSTRUCTING PREDICTION MODEL THAT PREDICTS NUMBER OF PLATEABLE SUBSTRATES, METHOD OF CONSTRUCTING SELECTION MODEL FOR PREDICTING COMPONENT THAT CAUSES FAILURE, AND METHOD OF PREDICTING NUMBER OF PLATEABLE SUBSTRATES

(71) Applicant: Ebara Corporation, Tokyo (JP)

(72) Inventors: Kunio Oishi, Tokyo (JP); Masashi Shimoyama, Tokyo (JP); Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 489 days.

(21) Appl. No.: 16/705,356

(22) Filed: Dec. 6, 2019

(65) Prior Publication Data
US 2020/0193294 A1  Jun. 18, 2020

(30) Foreign Application Priority Data
Dec. 13, 2018 (JP) .............................. JP2018-233823

(51) Int. Cl.
*G06F 11/00* (2006.01)
*G06N 3/08* (2006.01)
(Continued)

(52) U.S. Cl.
CPC ............ *G06N 3/08* (2013.01); *G06F 11/0751* (2013.01); *G06F 11/1048* (2013.01);
(Continued)

(58) Field of Classification Search
CPC ............ G06F 11/1048; G06F 11/2263; G06F 11/3409; G06F 11/22; G06F 11/0751;
(Continued)

(56) References Cited

U.S. PATENT DOCUMENTS 6,346,678 B1 *  2/2002  Kono ................... H05K 3/0035
                                                    174/262
7,808,613 B2 * 10/2010  Lof ......................... G03F 7/706
                                                    355/53
(Continued)

FOREIGN PATENT DOCUMENTS

JP         2018-003102 A       1/2018

*Primary Examiner* — Sarai E Butler
(74) *Attorney, Agent, or Firm* — Venjuris, P.C.

(57) ABSTRACT

A method of the present disclosure includes: plating a plurality of substrates using a substrate holder; determining a total number of substrates that have been plated using the substrate holder until a failure occurs in the substrate holder; determining a first processable number and a second processable number; generating a first data set constituted by a combination of first condition data and the first processable number, the first condition data representing a state of a component of the substrate holder; generating a second data set constituted by a combination of second condition data and the second processable number, the second condition data representing a state of a component of the substrate holder; and optimizing a parameter of a prediction model constituted by a neural network using training data including the first data set and the second data set.

13 Claims, 12 Drawing Sheets

(51) Int. Cl.
  *H01L 21/67* (2006.01)
  *G06N 3/04* (2006.01)
  *G06F 11/07* (2006.01)
  *G06F 11/10* (2006.01)
  *G06F 11/22* (2006.01)
  *G06F 11/34* (2006.01)
(52) U.S. Cl.
  CPC ...... *G06F 11/2263* (2013.01); *G06F 11/3409* (2013.01); *G06N 3/04* (2013.01); *H01L 21/67276* (2013.01)
(58) Field of Classification Search
  CPC .......... G06N 3/08; G06N 3/04; G06N 3/0751; G06N 3/1048; G06N 3/2263; G06N 3/3409; G06N 5/003; H01L 21/67276; C25D 21/12; C25D 17/004; C25D 17/005; C25D 17/06; C25D 17/001
  USPC ...................................................... 714/1–57
  See application file for complete search history.

(56) References Cited

U.S. PATENT DOCUMENTS

| | | | |
|---|---|---|---|
| 2005/0205660 A1* | 9/2005 | Munte | G06Q 20/389 235/379 |
| 2012/0052654 A1* | 3/2012 | Yang | H01L 21/6835 156/60 |
| 2012/0258408 A1* | 10/2012 | Mayer | C25D 17/008 204/229.5 |
| 2013/0130702 A1* | 5/2013 | Choi | H04L 27/2692 455/447 |
| 2013/0315576 A1* | 11/2013 | Nishihara | H01L 21/67115 392/416 |
| 2014/0262794 A1* | 9/2014 | Gebregziabiher | H01L 21/76898 205/104 |
| 2016/0130702 A1* | 5/2016 | Nakagawa | C23C 18/1628 427/437 |
| 2018/0096906 A1* | 4/2018 | Levy | H01L 22/12 |

* cited by examiner

FIG. 6

| COMPONENTS OF SUBSTRATE HOLDER | STATE CHANGE | PROBLEM OF SUBSTRATE HOLDER | | DATA TYPE |
| --- | --- | --- | --- | --- |
| | | LIQUID LEAKAGE | POOR ENERGIZATION | |
| SEAL HOLDER | DISCOLORATION | ○ | △ | IMAGE DATA |
| | DEFORMATION | ○ | △ | SURFACE SHAPE DATA |
| | CRYSTAL RESIDUE | ○ | △ | IMAGE DATA |
| FIRST HOLDING MEMBER | DISCOLORATION | ○ | △ | IMAGE DATA |
| | DEFORMATION | ○ | △ | SURFACE SHAPE DATA |
| | CRYSTAL RESIDUE | ○ | △ | IMAGE DATA |
| FIRST ELECTRICAL CONTACT | DEFORMATION | △ | ○ | SURFACE SHAPE DATA |
| | PEELING OF Au | ○ | ○ | IMAGE DATA |
| | METAL DEPOSITION | ○ | ○ | IMAGE DATA |
| | CRYSTALLIZATION OF COPPER SULFATE | ○ | ○ | IMAGE DATA |
| SECOND ELECTRICAL CONTACT | DEFORMATION | △ | ○ | SURFACE SHAPE DATA |
| | PEELING OF Au | ○ | ○ | IMAGE DATA |
| | METAL DEPOSITION | ○ | ○ | IMAGE DATA |
| | CRYSTALLIZATION OF COPPER SULFATE | ○ | ○ | IMAGE DATA |
| DISCOLORATION | DEFORMATION | △ | ○ | SURFACE SHAPE DATA |
| | PEELING OF Au | △ | ○ | IMAGE DATA |
| | METAL DEPOSITION | △ | ○ | IMAGE DATA |
| | CRYSTALLIZATION OF COPPER SULFATE | △ | ○ | IMAGE DATA |
| SEAL | DEFORMATION | ○ | △ | SURFACE SHAPE DATA |
| | DISCOLORATION | ○ | △ | IMAGE DATA |
| SLIDE PLATE | DEFORMATION | ○ | △ | SURFACE SHAPE DATA |

IMAGE DATA AND SURFACE SHAPE DATA OF
A PLURALITY OF COMPONENTS

METHOD OF CONSTRUCTING PREDICTION MODEL THAT PREDICTS NUMBER OF PLATEABLE SUBSTRATES, METHOD OF CONSTRUCTING SELECTION MODEL FOR PREDICTING COMPONENT THAT CAUSES FAILURE, AND METHOD OF PREDICTING NUMBER OF PLATEABLE SUBSTRATES

CROSS-REFERENCE TO RELATED APPLICATIONS

This application is based on and claims priority from Japanese Patent Application No. 2018-233823, filed on Dec. 13, 2018, with the Japan Patent Office, the disclosure of which is incorporated herein in its entirety by reference.

TECHNICAL FIELD

The present disclosure relates to a method of constructing a prediction model that predicts the number of substrates that may be plated until a failure occurs in a substrate holder used in a plating apparatus, and in particular, a method of constructing a prediction model by machine learning such as deep learning. The present disclosure also relates to a method of predicting the number of substrates that may be plated using such a prediction model.

BACKGROUND

The plating apparatus immerses a substrate held by a substrate holder (e.g., a wafer) in a plating solution and applies a voltage between the substrate and an anode to deposit a conductive film on the surface of the substrate. The substrate holder includes a plurality of components such as a plurality of electrical contacts that establish an electrical connection between the substrate and a power source, a seal that isolates the electrical contacts from the plating solution, and a seal holder that holds the seal.

When a failure occurs in the substrate holder, it adversely affects the plating of the substrate. For example, when the seal is deformed, the plating solution enters the substrate holder, and the plating solution comes into contact with the electrical contacts. As a result, a conductive film having a target thickness is not formed on the substrate. Since the substrate holder has a component that contacts the substrate to be plated, the condition of the substrate holder greatly affects the plating result. Therefore, maintenance of the substrate holder is important to achieve favorable plating results.

DETAILED DESCRIPTION

It is desirable that the maintenance of the substrate holder is performed before the failure of the substrate holder occurs. However, it is difficult to accurately determine whether the maintenance of the substrate holder is necessary. For this reason, in the related art, there is a case where maintenance of the substrate holder is performed after a failure occurs in the substrate holder. However, in that case, since preparation for the maintenance may not be performed in advance, the maintenance takes time. Meanwhile, Japanese Patent Laid-Open Publication No. 2018-003102 describes a substrate holder inspection apparatus that includes an apparatus of inspecting an appearance of a substrate holder and cleans the substrate holder as necessary, but such a description only determines whether an abnormality occurs in the appearance of the substrate holder.

Therefore, the present disclosure provides a method of constructing a prediction model that may accurately predict when the maintenance of the substrate holder is required. Further, the present disclosure provides a method of constructing a selection model which may predict a component that causes a failure of the substrate holder from a plurality of components of the substrate holder that may cause the failure of the substrate holder. The present disclosure also provides a method of predicting the maintenance time of the substrate holder using such a prediction model.

According to an embodiment of the present disclosure, there is provided a method of constructing a prediction model which predicts the number of substrates that may be plated until a failure occurs in a substrate holder. The method includes: plating a plurality of substrates using the substrate holder; determining a total number of substrates that have been plated using the substrate holder until the failure occurs in the substrate holder; determining a first processable number and a second processable number which are numbers of substrates that may be plated until the failure occurs in the substrate holder; generating a first data set constituted by a combination of first condition data corresponding to the first processable number and the first processable number, the first condition data representing a state of a component of the substrate holder; generating a second data set constituted by a combination of second condition data corresponding to the second processable number and the second processable number, the second condition data representing the state of the component; and optimizing a parameter of the prediction model constituted by a neural network using training data including the first data set and the second data set.

According to an embodiment of the present disclosure, the first processable number is 0, the first condition data is defect condition data representing the state of the component of the substrate holder when the failure occurs, and the first data set is a defect data set including a combination of the defect condition data and 0.

According to an embodiment of the present disclosure, the second processable number is a processable number obtained by subtracting an intermediate number smaller than the total number from the total number, the second condition data is intermediate condition data representing a state of the component when plating the intermediate number of substrates, and the second data set is an intermediate data set including a combination of the intermediate condition data and the second processable number.

According to an embodiment of the present disclosure, the first processable number is a processable number obtained by subtracting a first intermediate number smaller than the total number from the total number, the first condition data is first intermediate condition data representing a state of the component when plating the first intermediate number of substrates, the first data set is a first intermediate data set constituted by a combination of the first intermediate condition data and the first processable number, the second processable number is a processable number obtained by subtracting a second intermediate number smaller than the first intermediate number from the total number, the second condition data is second intermediate condition data representing a state of the component when plating the second intermediate number of substrates, and the second data set is a second intermediate data set constituted by a combination of the second intermediate condition data and the second processable number.

According to an embodiment of the present disclosure, each of the first condition data and the second condition data includes any one of image data and surface shape data of the substrate holder.

According to an embodiment of the present disclosure, the prediction model includes a neural network having an input layer, at least two intermediate layers, and an output layer.

According to an embodiment of the present disclosure, the prediction model is updated by repeating steps from the plating the plurality of substrates, the determining the total number of substrates, the determining the first processable number and the second processable number, the generating the first data set, the generating the second data set, and the optimizing the parameter of the prediction model.

An embodiment of the present disclosure further includes: generating a selection data set including a numerical value set indicating that a cause of the failure of the substrate holder is in the component, reference condition data representing a state of other component of the substrate holder when the failure occurs, and defect condition data representing the state of the other component when the failure occurs; and optimizing a parameter of a selection model constituted by a neural network using the selection data set.

According to an embodiment of the present disclosure, there is provided a method of preparing a prediction model constructed using the method described above, inputting the latest condition data representing the state of the components of the currently used substrate holder to the prediction model, and outputting the number of processable substrates from the prediction model.

An embodiment of the present disclosure further includes writing the predictable number on an electronic tag attached to the currently used substrate holder.

According to an embodiment of the present disclosure, there is provided a method of constructing a selection model for predicting a component that causes a failure of a substrate holder from a plurality of components of the substrate holder that may cause the failure of the substrate holder. The method includes: plating a plurality of substrates until the failure occurs in a first substrate holder due to a first component of the first substrate holder; generating a first selection data set including a first numerical value set indicating that a cause of the failure of the first substrate holder is the first component, first reference condition data representing a state of a second component of the first substrate holder when the failure occurs, and first defect condition data representing a state of the first component when the failure occurs; optimizing a parameter of a selection model constituted by a neural network using the first selection data set; plating the plurality of substrates until a failure occurs in a second substrate holder due to the second component of the second substrate holder; generating a second selection data set including a second numerical value set indicating that a cause of the failure of the second substrate holder is the second component, second reference condition data representing a state of a first component of the second substrate holder when the failure occurs, and second defect condition data representing a state of the second component when the failure occurs; and further optimizing the parameter using the second selection data set.

According to an embodiment of the present disclosure, each of the first reference data and the first defect condition data is constituted by any one of image data and surface shape data of the first substrate holder, and each of the second reference condition data and the second defect condition data is constituted by any one of image data and surface shape data of the second substrate holder.

According to an embodiment of the present disclosure, a method includes: inputting latest condition data of a first component and a second component of a substrate holder representing a state of a component of a currently used substrate holder to the selection model constructed by the method described above; when a first certainty factor corresponding to the first component output from the selection model is higher than a second certainty factor corresponding to the second component, inputting the latest condition data of the first component to a prediction model corresponding to the first component; and outputting a number of predictable substrates of the substrate holder from the prediction model. The prediction model is a prediction model constructed by the method described above.

According to the present disclosure, it is possible to construct a prediction model that may accurately predict the number of substrates that may be plated until a failure occurs in the substrate holder. Further, according to the present disclosure, it is possible to construct a selection model that may predict a component that causes a failure of the substrate holder from a plurality of components of the substrate holder that may cause the failure of the substrate holder. Further, according to the present disclosure, it is possible to accurately predict the number of substrates that may be plated using the prediction model until a failure occurs in the substrate holder.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a table listing types of state change of each component of the substrate holder that may cause liquid leakage and poor energization.

DESCRIPTION OF EMBODIMENT

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Figure 1:
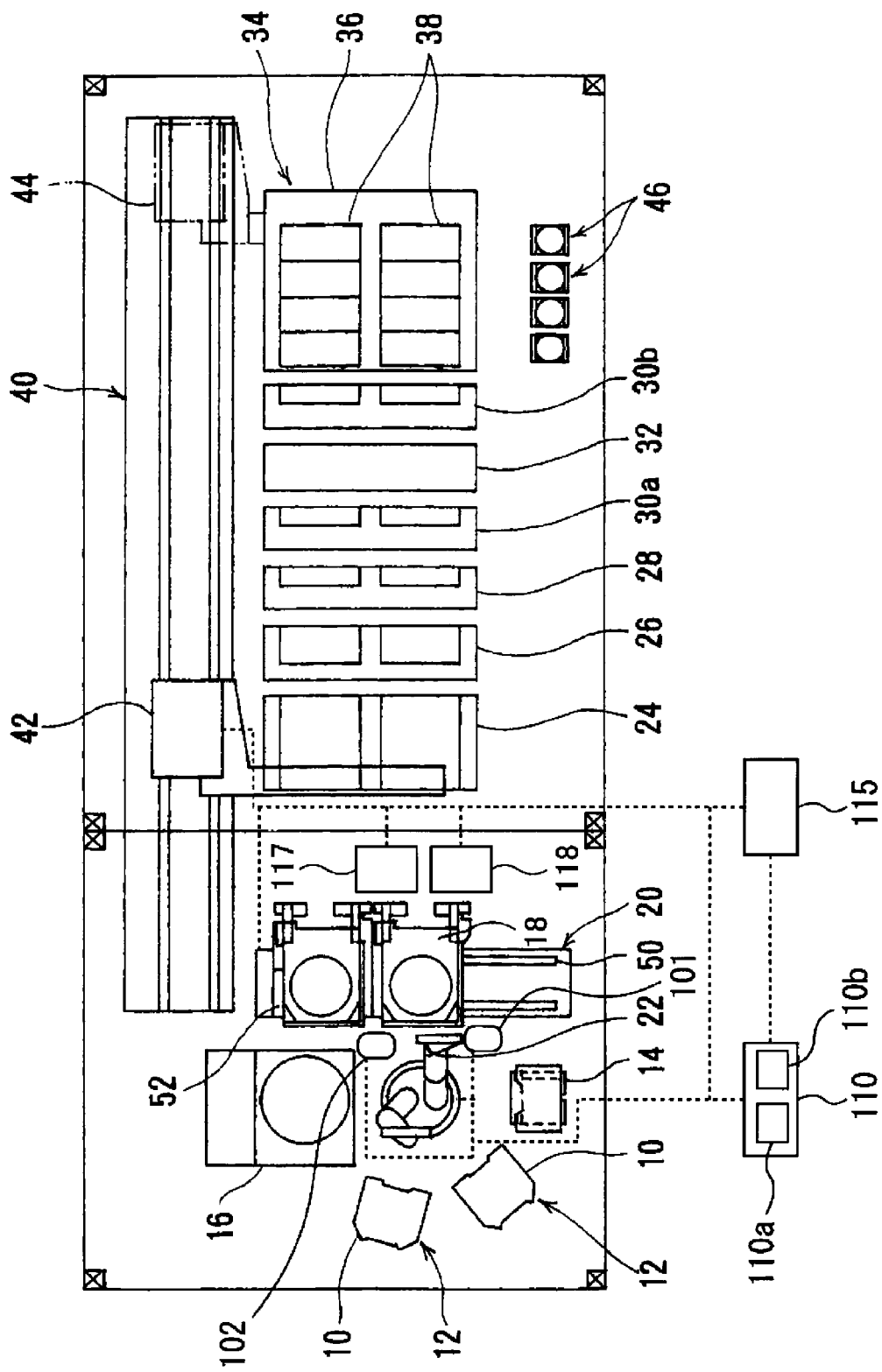
FIG. 1 is an overall layout view of a plating apparatus.
Figure 2:
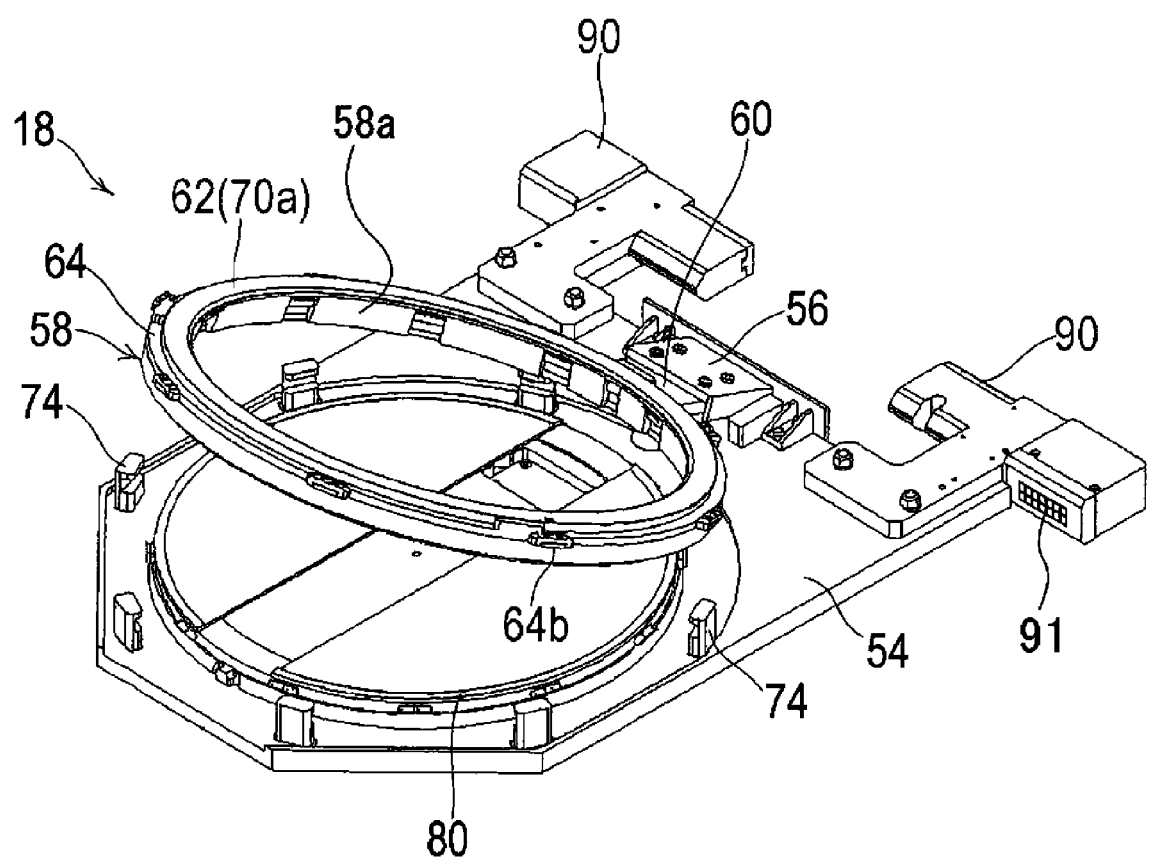
FIG. 2 is a perspective view schematically illustrating a substrate holder illustrated in FIG. 1.

Embodiments of the present disclosure will be described below with reference to the drawings. FIG. 1 is an overall layout view of a plating apparatus. As illustrated in FIG. 1, the plating apparatus includes two cassette tables 12 on which a cassette 10 accommodating a substrate such as a wafer is mounted, an aligner 14 that aligns notches such as an orientation flat and a notch of the substrate in a predetermined direction, and a spin rinse dryer 16 that rotates the substrate after plating treatment at high speed to dry the substrate.

A fixing station 20 is provided in the vicinity of the spin rinse dryer 16 to dispose the substrate holder 18 and attach/detach the substrate to/from the substrate holder 18. Further, a substrate transport device 22 including a transport robot that transports a substrate among the cassette 10, the aligner 14, the spin rinse dryer 16, and the fixing station 20 is disposed. The fixing station 20 is provided with an imaging device 101 that photographs the substrate holder 18 and a three-dimensional measuring device 102 that measures the surface shape of the substrate holder 18.

The imaging device 101 and the three-dimensional measuring device 102 are electrically connected to an arithmetic system 110 that executes a machine learning. The imaging device 101 and the three-dimensional measuring device 102 are configured to be capable of transmitting generated image data and surface shape data to the arithmetic system 110. The arithmetic system 110 is constituted by at least one computer. The arithmetic system 110 includes a storage device 110a that stores the image data and the surface shape data. The arithmetic system 110 further includes a processing device 110b such as a central processing unit (CPU) or a graphic processing unit (GPU).

In FIG. 1, the arithmetic system 110 is schematically depicted. The arithmetic system 110 may be an edge server connected to the plating apparatus via a communication line, a cloud server connected to the plating apparatus via a network such as the Internet, or a fog computing device installed in the network (e.g., a gateway, a fog server, a router, etc.). The arithmetic system 110 may be a combination of a plurality of servers (computers). For example, the arithmetic system 110 may be a combination of an edge server which is disposed near the plating apparatus and a cloud server which is far from the plating apparatus. A plurality of servers (computers) constituting the arithmetic system 110 may or may not be connected to each other via a network such as the Internet.

Further, a stocker 24 that stores and temporarily holds the substrate holder 18, a pre-wet tank 26 that hydrophilizes the surface of the substrate, and a pretreatment tank 28 that etches away an oxide film on the surface of a conductive film such as a seed layer formed on the surface of the substrate, a first water washing tank 30a that washes the substrate after pretreatment, a blow tank 32 that drains the washed substrate, a second water washing tank 30b that washes the substrate after plating, and a plating tank 34 are arranged in this order. The plating tank 34 is configured by accommodating a plurality of plating cells 38 inside the overflow tank 36, and each of the plating cells 38 accommodates a single substrate inside and is subjected to copper plating, metal plating (Sn, Au, Ag, Ni, Ru, or In plating), or alloy plating (Sn/Ag alloy, Sn/In alloy, etc.).

In addition, the plating apparatus is provided with a substrate holder transport device 40 that transports the substrate holder 18 together with the substrate, for example, employs a linear motor system. The substrate holder transport device 40 is provided with a first transporter 42 that transports a substrate among the fixing station 20, the stocker 24, and the pre-wet tank 26, and a second transporter 44 that transports a substrate among the stocker 24, the pre-wet tank 26, the pretreatment tank 28, the first water washing tank 30a, the second water washing tank 30b, the blow tank 32, and the plating tank 34. Only the first transporter 42 may be provided without the second transporter 44. In this case, the first transporter 42 is configured to transport a substrate among the fixing station 20, the stocker 24, the pre-wet tank 26, the pretreatment tank 28, the first water washing tank 30a, the second water washing tank 30b, the blow tank 32, and the plating tank 34.

Further, the plating apparatus includes a controller 115. The imaging device 101, the three-dimensional measuring device 102, the arithmetic system 110, the fixing station 20, the substrate transport device 22, and the substrate holder transport device 40 are electrically connected to the controller 115. Operations of the imaging device 101, the three-dimensional measuring device 102, the fixing station 20, the substrate transport device 22, and the substrate holder transport device 40 are controlled by the controller 115. The arithmetic system 110 transmits the prediction result of the maintenance time to the controller 115, and the controller 115 controls the imaging device 101, the three-dimensional measuring device 102, and the substrate holder transport device 40 based on the prediction result of the maintenance time.

A paddle driving device 46 is disposed inside each plating cell 38 adjacent to the overflow tank 36 of the plating tank 34 to drive a paddle as a stirring rod that stirs the plating solution (not illustrated).

The fixing station 20 includes a mounting plate 52 that may slide horizontally along a rail 50. After displacing the two substrate holders 18 in parallel in a horizontal state on the mounting plate 52 and transferring the substrate between the one substrate holder 18 and the substrate transport device 22, the mounting plate 52 is slid in the horizontal direction to transfer the substrate between the other substrate holder 18 and the substrate transport device 22.

As illustrated in FIGS. 2 to 5, the substrate holder 18 includes a first holding member (base holding member) 54 which is made of, for example, vinyl chloride and has a rectangular flat plate shape, and a second holding member (movable holding member) 58 which is attached to the first holding member 54 via a hinge 56 so as to be opened and closed. Meanwhile, this example illustrates that the second holding member 58 is configured to be able to be opened and closed via the hinge 56. However, for example, the second holding member 58 may be disposed at a position facing the first holding member 54, and the second holding member 58 may be advanced toward the first holding member 54 so as to be opened and closed.

The second holding member 58 has a base 60 and a seal holder 62. The seal holder 62 is made of, for example, vinyl chloride, and improves sliding with a slide plate 64 described below. When a substrate W is held by the substrate holder 18, a seal (first seal protrusion) 66 is attached to the upper surface of the seal holder 62 so as to protrude inward in pressure contact with an outer peripheral portion of the surface of the substrate W and seal a gap between the substrate W and the second holding member 58. Further, when the substrate W is held by the substrate holder 18, a seal (second seal protrusion) 68 is attached to the surface of the seal holder 62 facing the first holding member 54 so as to protrude inward in pressure contact the first holding member 54 and seal a gap between the first holding member 54 and the second holding member 58. The seal 68 is located outside the seal 66.

The seal (first seal protrusion) 66 and the seal (second seal protrusion) 68 are endless seals. The seal 66 and the seal 68 may be a seal member such as an O-ring. In an embodiment, the second holding member 58 itself including the seal 66 and the seal 68 may be made of a material having a sealing function. In the present embodiment, the seal 66 and the seal 68 are annular and are arranged concentrically. When plating the substrate W, the substrate holder 18 holding the substrate W is disposed in the plating cell 38 in a vertical posture. When the substrate holder 18 is disposed in the plating cell in a horizontal posture, the seal 68 may be omitted.

Figure 5:
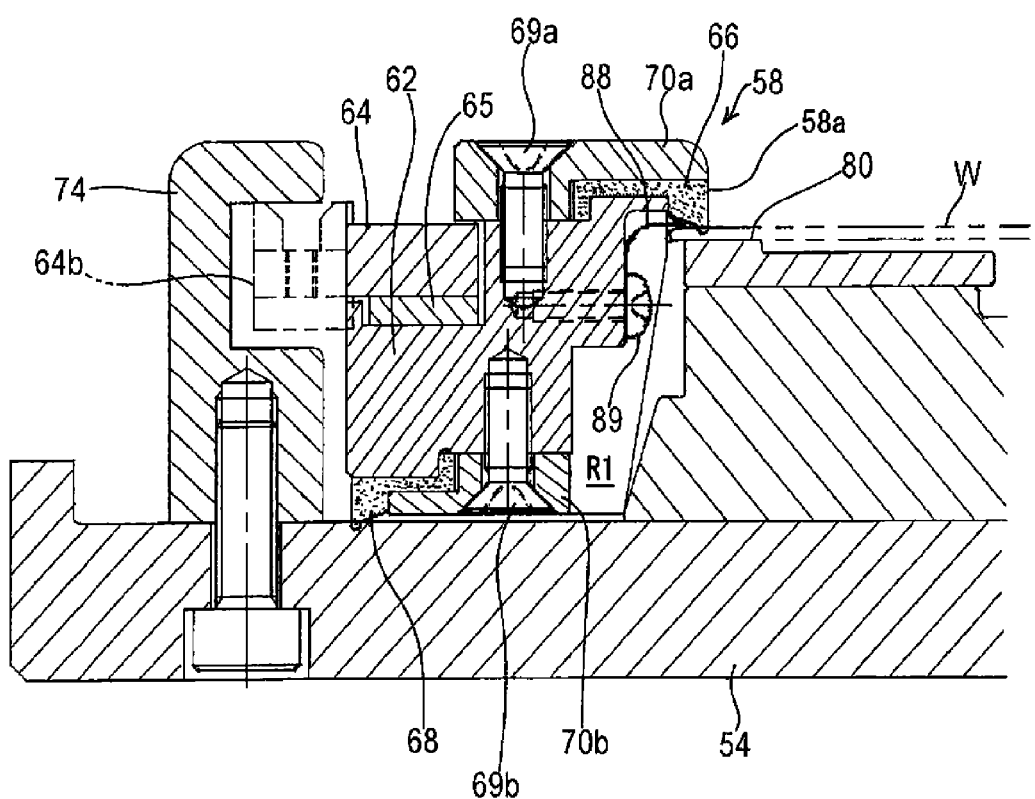
FIG. 5 is an enlarged view of a part A in FIG. 4.

As illustrated in FIG. 5, the seal 66 is sandwiched between the seal holder 62 and a first fixing ring 70a so as to be attached to the seal holder 62. The first fixing ring 70a is attached to the seal holder 62 via a fastener 69a such as a bolt. The seal 68 is sandwiched between the seal holder 62 and a second fixing ring 70b so as to be attached to the seal holder 62. The second fixing ring 70b is attached to the seal holder 62 via a fastener 69b such as a bolt.

A step portion is provided on the outer peripheral portion of the seal holder 62 of the second holding member 58, and the slide plate 64 is rotatably attached to the step portion via a spacer 65. The slide plate 64 is mounted so as not to escape by a presser plate 72 (see, e.g., FIG. 3) which is attached to the side surface of the seal holder 62 so as to protrude outward. The slide plate 64 is made of, for example, titanium that has excellent corrosion resistance against acids and alkalis, and sufficient rigidity. The spacer 65 is made of a material having a low coefficient of friction, such as PTFE, so that the slide plate 64 may rotate smoothly.

Located on the outer side of the slide plate 64, the first holding member 54 is provided with inverted L-shaped clampers 74 having protruding portions that protrude inward at an equal interval along the circumferential direction. Meanwhile, a protruding portion 64b that protrudes outward is provided at a position facing the clamper 74 along the circumferential direction of the slide plate 64. Further, the lower surface of the inwardly protruding portion of the clamper 74 and the upper surface of the protruding portion 64b of the slide plate 64 are tapered surfaces that are inclined in opposite directions along the rotation direction. Convex portions 64a protruding upward are provided at a plurality of locations (e.g., 3 locations) along the circumferential direction of the slide plate 64. Thus, the slide plate 64 may be rotated by rotating the rotation pin of the fixing station 20 (not illustrated) and pushing the convex portion 64a from the side.

In a state where the second holding member 58 is opened, the substrate W is placed at the center of the first holding member 54. Next, the second holding member 58 is closed via the hinge 56, the slide plate 64 is rotated clockwise, and the protruding portion 64b of the slide plate 64 is slid into the inner protruding portion of the clamper 74, so that the first holding member 54 and the second holding member 58 are fastened and locked to each other via the tapered surfaces provided on the slide plate 64 and the clamper 74, respectively, and the slide plate 64 is rotated counterclockwise to remove the protruding portion 64b of the slide plate 64 from the inverted L-shaped clamper 74 and release the lock.

When the second holding member 58 is locked in this way (i.e., when the substrate holder 18 holds the substrate W), the lower end of the lower protruding portion on the inner peripheral surface of the seal 66 is uniformly pressed against the outer peripheral portion of the surface of the substrate W, and a gap between the second holding member 58 and the outer peripheral portion of the surface of the substrate W is sealed by the seal 66. Similarly, the lower end of the lower protruding portion on the outer peripheral side of the seal 68 is uniformly pressed against the surface of the first holding member 54, and a gap between the first holding member 54 and the second holding member 58 is sealed by the seal 68.

The substrate holder 18 holds the substrate W by sandwiching the substrate W between the first holding member 54 and the second holding member 58. The second holding member 58 has a circular opening 58a. The opening 58a is slightly smaller than the size of the substrate W. When the substrate W is sandwiched between the first holding member 54 and the second holding member 58, the processed surface of the substrate W is exposed through the opening 58a. Therefore, various processing liquids such as a prewetting liquid, a pretreatment liquid, and a plating liquid (to be described later) may come into contact with the exposed surface of the substrate W held by the substrate holder 18. The exposed surface of the substrate W is surrounded by a seal (first seal protrusion) 66.

When the substrate W is held by the substrate holder 18, an internal space R1 in which the inner peripheral side is sealed with the seal 66 and the outer peripheral side is sealed with the seal 68 is formed inside the substrate holder 18, as illustrated in FIG. 5. A protruding portion 82 is provided at the center portion of the first holding member 54 to have a support surface 80 that protrudes in a ring shape in accordance with the size of the substrate W and contacts the outer peripheral portion of the substrate W to support the substrate W. A concave portion 84 is provided at a predetermined position along the circumferential direction of the protruding portion 82.

Figure 3:
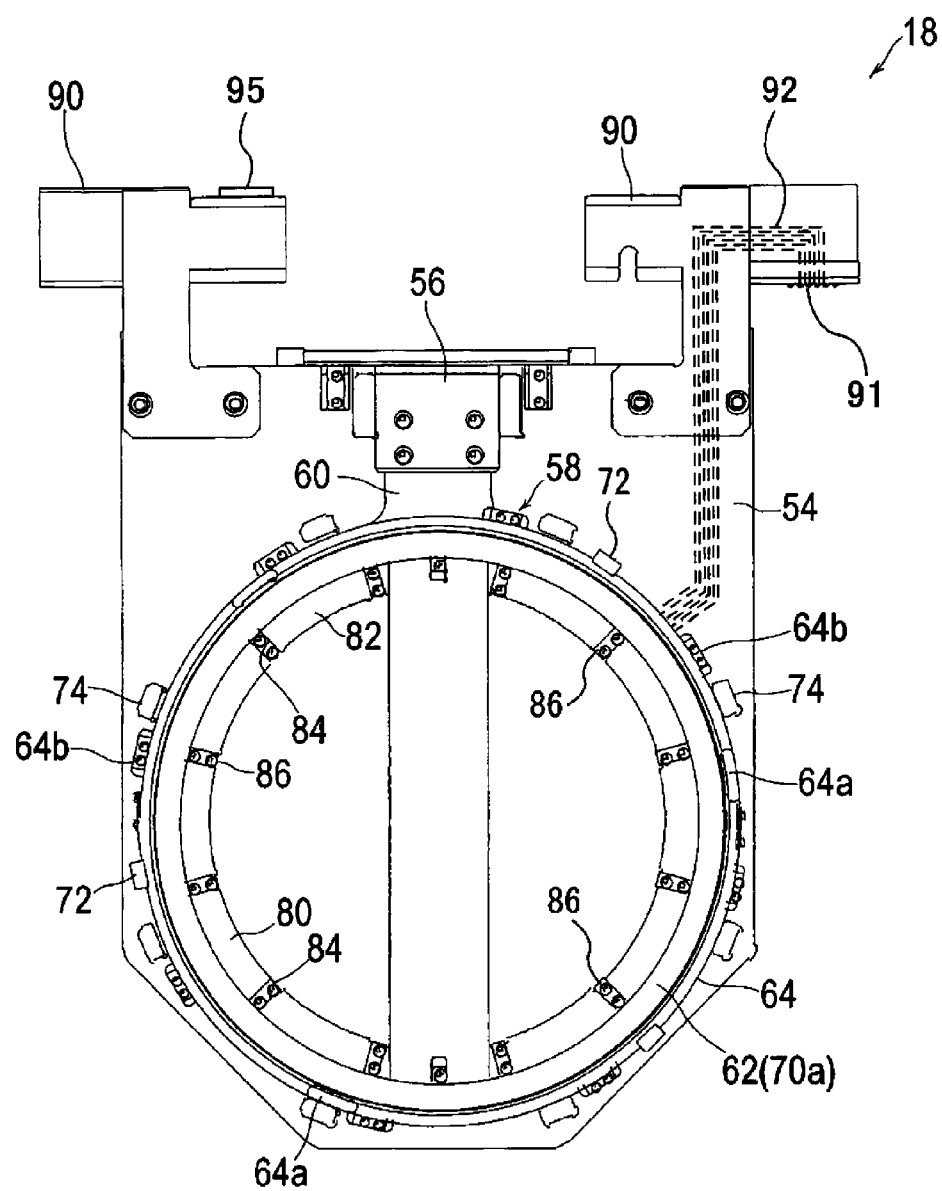
FIG. 3 is a plan view schematically illustrating the substrate holder illustrated in FIG. 1.
Figure 4:
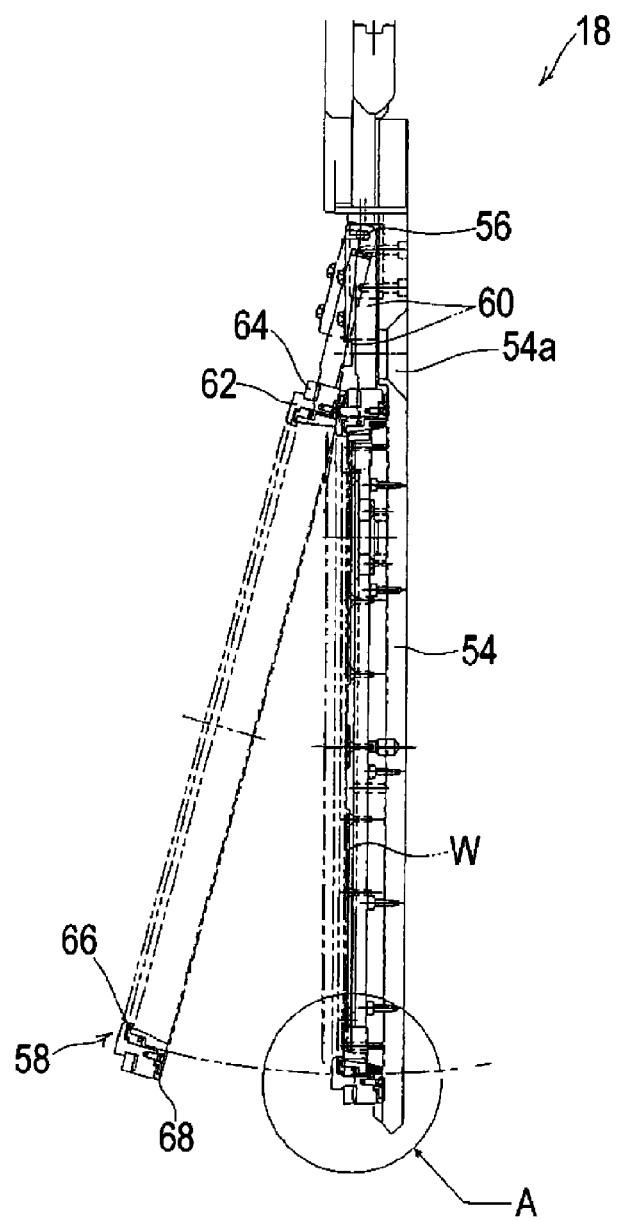
FIG. 4 is a right-side view schematically illustrating the substrate holder illustrated in FIG. 1.

In addition, as illustrated in FIG. 3, a plurality (12 in the figure) of second electrical contacts 86 are arranged in each of the concave portions 84, and the second electrical contacts 86 are respectively connected to a plurality of electric wires 92 extending from external electrical contacts 91 provided on a hand 90. When the substrate W is disposed on the support surface 80 of the first holding member 54, the end portion of the second electrical contact 86 is exposed on the surface of the first holding member 54 on the side of the substrate W in a springy state so as to contact the lower portion of the first electrical contact 88 illustrated in FIG. 5.

The first electrical contact 88 electrically connected to the second electrical contact 86 is fixed to the seal holder 62 of the second holding member 58 via a fastener 89 such as a bolt. The first electrical contact 88 has a leaf spring shape. The first electrical contact 88 is located on the outer side of the seal 66, has a contact portion that protrudes inward in a leaf spring shape, and is easily bent at the contact portion with springiness due to its elastic force. When the substrate W is held by the first holding member 54 and the second holding member 58, the contact portion of the first electrical contact 88 is configured to elastically contact the outer peripheral surface of the substrate W supported on the support surface 80 of the first holding member 54.

The second holding member 58 is opened and closed by the weight of an air cylinder (not illustrated) and the second holding member 58. That is, the first holding member 54 is provided with a through hole 54a, and an air cylinder is provided at a position facing the through hole 54a when the substrate holder 18 is placed on the fixing station 20. As a result, a piston rod is extended, the second holding member 58 is opened by pushing the seal holder 62 of the second holding member 58 upward with a pressing rod (not illustrated) via the through hole 54a, and the second holding member 58 is closed by its own weight by contracting a piston rod.

A pair of substantially T-shaped hands 90 is provided at the end of the first holding member 54 of the substrate holder 18 to serve as support portions when the substrate holder 18 is transported or suspended. In the stocker 24, the substrate holder 18 is suspended vertically by hooking the hand 90 on the upper surface of the peripheral wall of the stocker 24. The suspended hand 90 of the substrate holder 18 is held by the transporter 42 or 44 of the substrate holder transport device 40 to transport the substrate holder 18. Meanwhile, also in the pre-wet tank 26, the pretreatment tank 28, the first water washing tank 30a, the second water washing tank 30b, the blow tank 32, and the plating tank 34, the substrate holder 18 is suspended from the peripheral walls thereof via the hand 90.

The substrate W used in the present embodiment is a circular substrate such as a wafer, but the present disclosure may also be applied to a rectangular substrate. Each component of the substrate holder that holds the rectangular substrate has a shape that matches the shape of the substrate. For example, the opening 58a described above is a rectangular opening which is smaller than the size of the entire rectangular substrate. Other components such as the seals 66 and 68 are also shaped to match the shape of the rectangular substrate. The shape of each of other components is also changed as appropriate without departing from the technical idea described above.

As described above, the substrate holder 18 is a composite assembly constituted by a plurality of components such as the seals 66 and 68, the first electrical contact 88, the second electrical contact 86, the external electrical contact 91, the seal holder 62, and the first holding member 54. The components may be deformed or corrode as the substrate holder 18 is used to plate a plurality of substrates. For example, when the first electrical contact 88 is deformed, an appropriate current may not be caused to pass through the substrate. In another example, when the seals 66 and 68 are deformed, the plating solution enters the internal space R1 of the substrate holder 18 and the plating solution comes into contact with the electrical contacts 86 and 88. As a result, defective plating occurs. For this reason, it is important to perform maintenance of the substrate holder 18 before defective plating occurs.

In the present embodiment, the maintenance time of the substrate holder 18 is predicted using a prediction model constructed by machine learning. The prediction model is a model that predicts the number of substrates that may be plated using the substrate holder 18 until a failure occurs in the substrate holder 18. In the present specification, machine learning refers to learning performed using a neural network, and includes deep learning. The machine learning is executed by the arithmetic system 110 configured by at least one computer. The arithmetic system 110 includes the storage device 110a that stores a program which causes the arithmetic system 110 to execute machine learning, and a processing device 110b that performs computation according to the program.

The state of each component of the substrate holder 18 gradually changes as the substrate is repeatedly plated. A change in the state of each component may cause a failure of the substrate holder 18. Examples of failure of the substrate holder 18 include liquid leakage and poor energization. The liquid leakage refers to a state where the plating solution enters the internal space R1 of the substrate holder 18 due to an insufficient sealing function. The poor energization refers to a state where a desired current does not flow through the substrate held by the substrate holder 18. When liquid leakage or poor conduction occurs, the plating apparatus may not form a film having the intended thickness on the surface of the substrate.

There are various causes of liquid leakage and poor conduction. FIG. 6 is a table listing the types of state change of each component of the substrate holder 18 that may cause liquid leakage and poor energization. In FIG. 6, a circle (O) indicates that a change in the state of the component is highly likely to cause liquid leakage or poor energization, and a triangle (Δ) indicates that it is unclear whether the change in the state of the component may cause liquid leakage or poor energization. Further, the table illustrated in FIG. 6 lists the types of data used to detect each state change. For example, the discoloration of the seal holder 62 refers to a state change that may cause liquid leakage, and the discoloration of the seal holder 62 is detected based on image data. The deformation of the electrical contacts 86 and 88 refers to a state change that may cause poor energization, and the deformation of the electrical contacts 86 and 88 is detected based on surface shape data.

A specific example of the state change of each component is as follows. However, the state change of each component is not limited to the following specific examples.

Seal holder 62: discoloration, deformation, crystal residue

First holding member 54: discoloration, deformation, crystal residue

First electrical contact 88: deformation, peeling of Au surface film, metal deposition, crystallization of copper sulfate contained in the plating solution Second electrical contact 86: deformation, peeling of Au surface film, metal deposition, crystallization of copper sulfate contained in the plating solution External electrical contact 91: deformation, peeling of Au surface film, metal deposition, crystallization of copper sulfate contained in the plating solution Seals 66 and 68: deformation, discoloration Slide plate 64: deformation Specific examples of deformation of each of the components include deformation caused by application of an external force, distortion caused by internal stress, and corrosion of the components.

In order to construct a prediction model that predicts a failure of the substrate holder 18, at least one of the image data and the surface shape data of each component is used. For example, the surface shape data is used to construct a prediction model that predicts a failure of the substrate holder 18 based on deformation of the seals 66 and 68, and the image data is used to construct a prediction model that predicts a failure of the substrate holder 18 based on discoloration of the seals 66 and 68.

Before holding a substrate to be plated, the image data and the surface shape data of each component of the substrate holder 18 are generated by the imaging device 101 and the three-dimensional measuring device 102, respectively. The arithmetic system 110 acquires the image data and the surface shape data from the imaging device 101 and the three-dimensional measuring device 102, and stores the image data and surface shape data in the storage device 110a. In an embodiment, the image data and the surface shape data of each component of the substrate holder 18 may be generated after the plated substrate is taken out from the substrate holder 18.

The imaging device 101 is a camera provided with an image sensor such as a CCD or a CMOS. The three-dimensional measuring device 102 is a device that may measure the surface shape of a target object, and, for example, a laser displacement meter is used. More specifically, the three-dimensional measuring device 102 measures the positions of a plurality of measurement points on the surface of the component, and outputs the X coordinate, the Y coordinate, and the Z coordinate of each measurement point as a position measurement value.

The arithmetic system 110 counts the cumulative number of substrates plated using a particular substrate holder 18 after the use of the substrate holder 18 is started. Specifically, each time a substrate is plated using the substrate holder 18, the arithmetic system 110 counts the cumulative number of substrates plated using the substrate holder 18. Further, each time the image data and the surface shape data are acquired from the imaging device 101 and the three-dimensional measuring device 102, the arithmetic system 110 associates the image data and the surface shape data with the current cumulative number of plated substrates. Then, the arithmetic system 110 stores the image data and the surface shape data in the storage device 110a in association with the current cumulative number of plated substrates.

After holding the substrate to be plated, the substrate holder 18 is connected to a leakage inspection device 117. The leakage inspection device 117 inspects whether the seals 66 and 68 of the substrate holder 18 are functioning normally. The leakage inspection device 117 forms a positive pressure or a negative pressure in the internal space R1 provided in the substrate holder 18 by the seals 66 and 68, and issues an alarm signal indicating that a failure has occurred in the substrate holder 18 when the pressure in the internal space R1 (a positive pressure or a negative pressure) exceeds allowable values within a predetermined time. When the pressure in the internal space R1 changes greatly, the plating solution may enter the internal space R1 during plating of the substrate. This means that a failure has occurred in the substrate holder 18 (i.e., liquid leakage). The leakage inspection device 117 is electrically connected to the controller 115.

Further, the substrate holder 18 is connected to an energization inspection device 118 while holding the substrate to be plated. The energization inspection device 118 sends a predetermined current to the substrate through the external electrical contact 91 of the substrate holder 18 and measures the internal resistance of the substrate holder 18. The internal resistance of the substrate holder 18 is a combined resistance of the substrate held by the external electrical contact 91, an electric wire 92, the first electrical contact 88, the second electrical contact 86, and the substrate holder 18. The internal resistance of the substrate holder 18 may vary according to a contact state between the first electrical contact 88 and the substrate, and a contact state between the first electrical contact 88 and the second electrical contact 86. For example, when the first electrical contact 88 corrodes, a contact resistance between the first electrical contact 88 and the substrate changes. As a result, the internal resistance of the substrate holder 18 changes.

When the measured value of the internal resistance is out of a predetermined setting range, the energization inspection device 118 issues an alarm signal indicating that a failure has occurred in the substrate holder 18. When the measured value of the internal resistance is out of the setting range, it is estimated that a failure occurs in at least one of the external electrical contact 91, the first electrical contact 88, and the second electrical contact 86. As a result, a film having a desired thickness may not be deposited on the substrate. This means that a failure (i.e., a poor energization) has occurred in the substrate holder 18. The energization inspection device 118 is electrically connected to the controller 115.

In an embodiment, the internal resistance of the substrate holder 18 may be measured not on the substrate to be plated but on the substrate holder 18 that holds a dummy substrate. Examples of the dummy substrate are a blanket substrate that has no pattern formed on the surface thereof, and a substrate that has a conductive film such as copper coated on the surface.

The image data and the surface shape data are sent to the arithmetic system 110 and stored in the storage device 110a. The storage device 110a stores a plurality of prediction models which predict the number of substrates that may be plated until a failure occurs in the substrate holder 18. When any one of the image data and the surface shape data is input to each prediction model, the prediction model outputs the predicted number of substrates that may be plated using the substrate holder 18.

The plurality of prediction models are provided corresponding to at least a plurality of components of the substrate holder 18 (the seal holder 62, the electrical contacts 86 and 88, the seals 66 and 68, etc.). Further, a plurality of prediction models are provided for each type of failure of the substrate holder 18 (liquid leakage, poor energization). This is because the predicted number of substrates that may be plated using the substrate holder 18 may vary for each component of the substrate holder 18 and may vary for each type of failure of the substrate holder 18. In an embodiment, a plurality of prediction models may be provided for each type of state change of the component of the substrate holder 18. That is, as many prediction models as the number of circles (O) and triangles (Δ) illustrated in the table of FIG. 6 may be provided. Further, in an embodiment, only one prediction model may be provided for the substrate holder 18.

Each of the plurality of prediction models is a model constituted by a neural network. The arithmetic system 110 constructs a prediction model by learning parameters of each prediction model (weights, etc.) using training data that includes at least one selected in advance from image data and surface shape data. The parameters of the prediction model may include a bias in addition to the weight.

In the present embodiment, the data representing the state of each component of the substrate holder 18 is constituted by image data and surface shape data. In an embodiment, only image data or surface shape data may be used as data representing the state of each component of the substrate holder 18.

Figure 7:
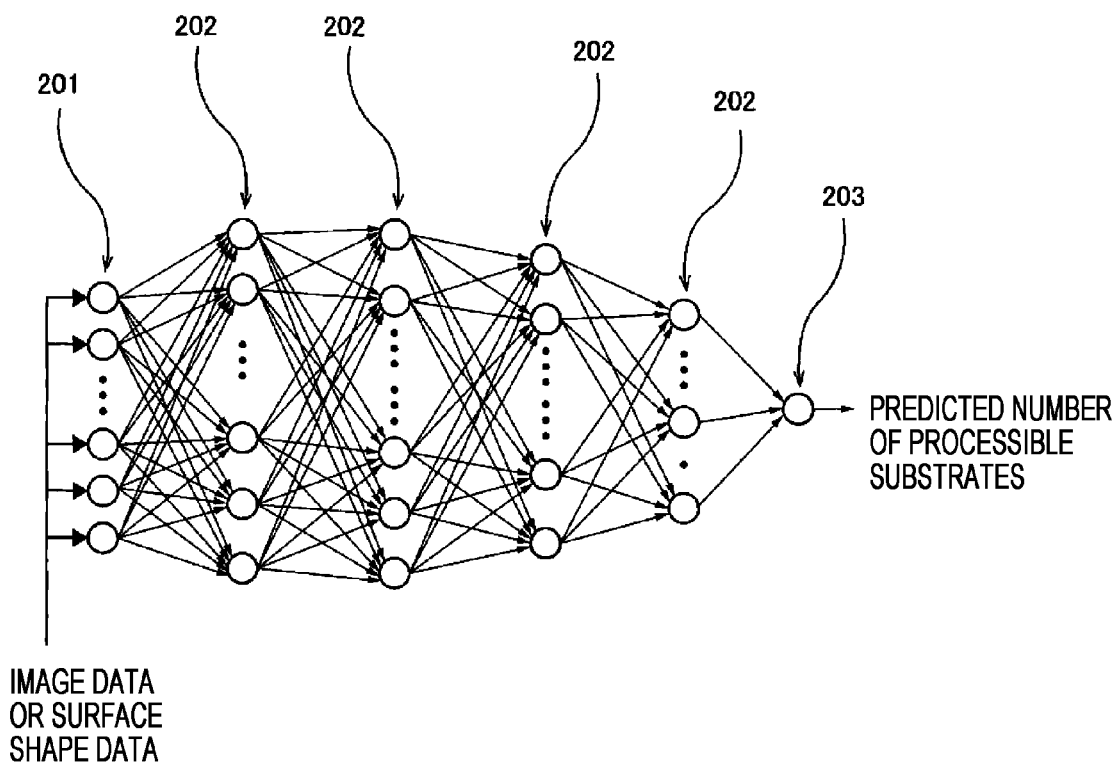
FIG. 7 is a schematic view illustrating an example of a prediction model.

FIG. 7 is a schematic view illustrating an example of a prediction model. As illustrated in FIG. 7, the prediction model is a neural network having an input layer 201, a plurality of intermediate layers (also referred to as hidden layers) 202, and an output layer 203. The prediction model illustrated in FIG. 7 includes four intermediate layers 202, but the configuration of the prediction model is not limited to the example illustrated in FIG. 7. Machine learning which is performed using a neural network having many intermediate layers 202 is called deep learning.

In the prediction model using image data, numerical values representing red, green, and blue of each pixel constituting the image data are input to the input layer 201. In the prediction model using the surface shape data, the X coordinate value, the Y coordinate value, and the Z coordinate value that represent the position of the measurement point on the surface of the component of the substrate holder 18 are input to the input layer 201. In any case, the output layer 203 outputs the number of substrates that may be plated until a failure occurs in the substrate holder 18. In the following description, the number of substrates output from the prediction model is referred to as a predictable number.

Figure 8:
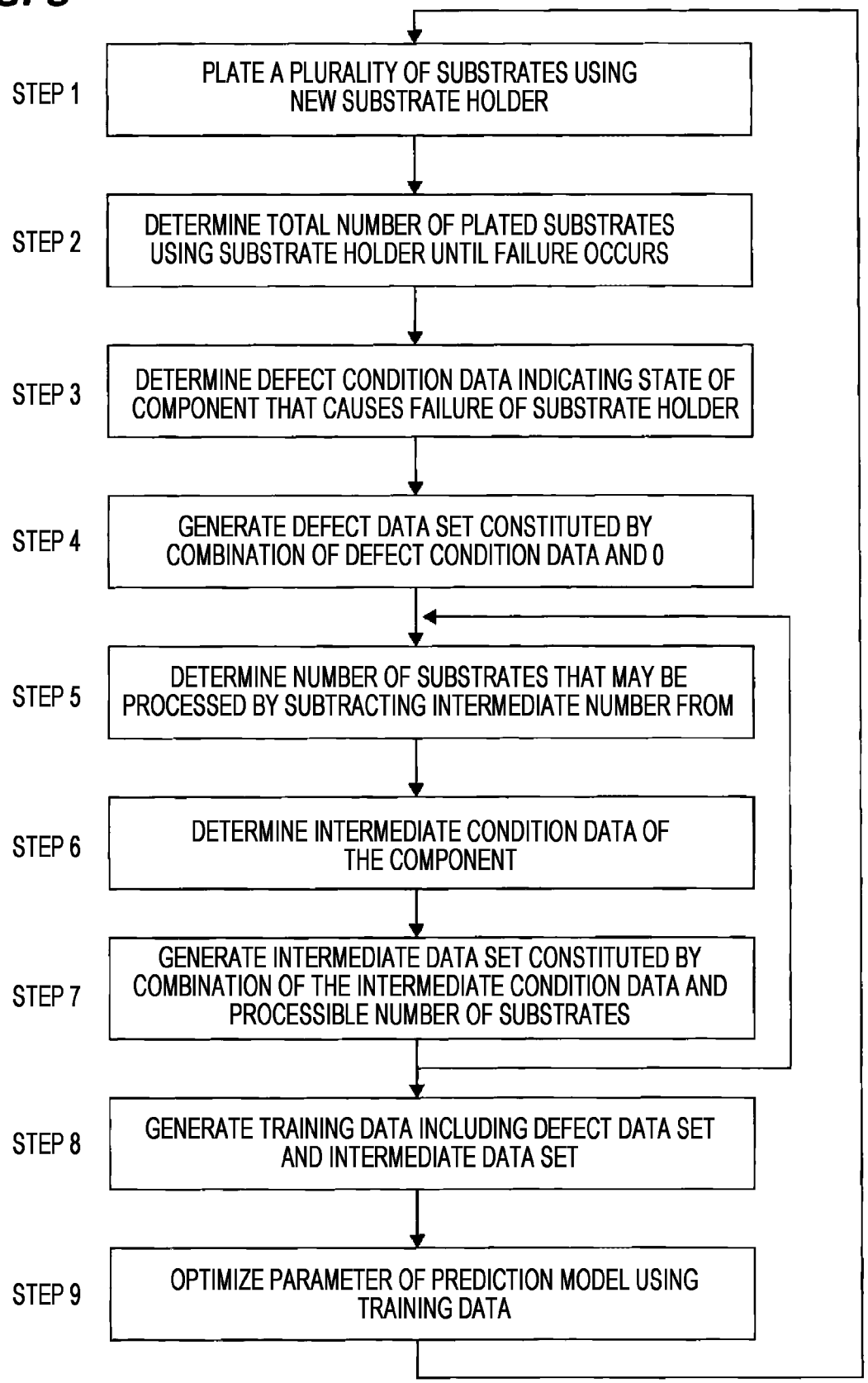
FIG. 8 is a flowchart illustrating an embodiment of a method for optimizing the parameters of a prediction model.

The arithmetic system 110 optimizes the parameters of the prediction model (weights, etc.) by machine learning using training data, and improves the accuracy of the prediction model. FIG. 8 is a flowchart illustrating an embodiment of a method for optimizing the parameters of a prediction model. In step 1, a plurality of substrates are plated using one new substrate holder 18. The plating of the substrates is performed by the plating apparatus illustrated in FIG. 1. Examples of the "new substrate holder 18" include not only unused substrate holders but also maintained substrate holders. Image data and surface shape data are generated by the imaging device 101 and the three-dimensional measuring instrument 102 before each substrate is held by the substrate holder 18. The arithmetic system 110 acquires image data and surface shape data from the imaging device 101 and the three-dimensional measuring device 102, and stores such data in the storage device 110a of the arithmetic system 110 together with the cumulative number of plated substrates.

Plating of a plurality of substrates using the new substrate holder 18 is performed until a failure occurs in the substrate holder 18. The user may know that a failure has occurred in the substrate holder 18 from an alarm signal issued from the leakage inspection device 117 or the energization inspection device 118. When a failure occurs in the substrate holder 18, the user takes out the substrate holder 18 from the plating apparatus, disassembles the substrate holder 18, and specifies the cause of the failure of the substrate holder 18. Further, the user gives to the arithmetic system 110 information that a failure has occurred in the substrate holder 18 due to a change in the state of the specified component using an input device, a communication device, or the like (not illustrated). Specifically, the user teaches the arithmetic system 110 the components to be used for the construction (learning) of the prediction model. For example, when the failure of the substrate holder 18 occurs due to deformation of the first electrical contact 88, the user gives to the arithmetic system 110 information that the component to be used for construction (learning) of the prediction model is the first electrical contact 88.

In step 2, the arithmetic system 110 determines the total number of substrates plated using the substrate holder 18 until the above-described failure occurs, and stores the determined total number of substrates in the storage device 110a. The total number of substrates is the cumulative number of substrates plated using the substrate holder 18 from the time when the use of the substrate holder 18 is started to the time when a failure occurs in the substrate holder 18. The total number of substrates corresponds to the latest cumulative number stored in the storage device 110a of the arithmetic system 110. Further, the number of substrates that may be plated using the substrate holder 18 when a failure occurs is 0.

In step 3, the arithmetic system 110 determines defect condition data representing the state of the component of the substrate holder 18 that is the cause of the failure of the substrate holder 18. The defect condition data is condition data representing the state of the component of the substrate holder 18 that has caused the failure of the substrate holder 18, and more specifically, is condition data representing the state of the component when the failure occurs in the substrate holder 18. The defect condition data constitutes parts of the image data and the surface shape data stored in the storage device 110a. The defect condition data includes any one of the image data and the surface shape data of the components. For example, when the failure of the substrate holder 18 occurs due to deformation of the first electrical contact 88, the defect condition data is the image data of the first electrical contact 88, that is, the latest image data of the first electrical contact 88 when the failure of the substrate holder 18 occurs.

In step 4, the arithmetic system 110 generates a defect data set constituted by a combination of defect condition data and 0. The numerical value 0 is the number of substrates that may be plated using the substrate holder 18, that is, the number of substrates that may be processed. The defect condition data is condition data corresponding to the numerical value 0.

In step 5, the arithmetic system 110 determines the number of substrates that may be processed by subtracting, from the total number, an intermediate number that is smaller than the total number obtained in step 2. For example, in a case where the total number of substrates when a failure occurs in the substrate holder 18 is 500 and the intermediate number is 200, the processable number is 300 (500–200).

In step 6, the arithmetic system 110 determines intermediate condition data corresponding to the processable number determined in step 5. The intermediate condition data is condition data representing the state of the component of the substrate holder 18 that is a cause of the failure of the substrate holder 18, and more specifically, is condition data representing the state of the component when the intermediate number of substrates is plated. Similarly to the defect condition data, the intermediate condition data constitutes parts of the image data and the surface shape data stored in the storage device 110a. The intermediate condition data is constituted by any one of the image data and the surface shape data of the component, and is the same type of data as the defect condition data. For example, when the defect condition data is surface shape data, the intermediate condition data is also surface shape data.

In step 7, the arithmetic system 110 generates an intermediate data set constituted by a combination of the intermediate condition data and the processable number of substrates determined in step 5.

Steps 5, 6, and 7 are repeated a predetermined number of times. More specifically, the arithmetic system 110 generates a plurality of intermediate data sets by repeatedly determining the processable number and generating the intermediate data set while changing the intermediate number. For example, in a case where the total number of plated substrates is 500 when a failure occurs in the substrate holder 18, the intermediate number is set to 100, 200, 300, and 400, respectively. The plurality of intermediate numbers are preferably evenly distributed between 0 and the total number. In the present embodiment, the number of substrates that may be processed is determined to be 400 (500–100), 300 (500–200), 200 (500–300), and 100 (500–400), respectively.

The arithmetic system 110 determines intermediate condition data corresponding to the processable number 400 (i.e., intermediate condition data of the component when 100 substrates are plated), intermediate condition data corresponding to the processable number 300 (i.e., intermediate condition data of the component when 200 substrates are plated), intermediate condition data corresponding to the processable number 200 (i.e., intermediate condition data of the component when 300 substrates are plated), and intermediate condition data corresponding to the processable number 100 (i.e., intermediate condition data of the component when 400 substrates are plated).

Further, the arithmetic system 110 generates an intermediate data set constituted by a combination of intermediate condition data of components when 100 substrates are plated and the processable number 400, an intermediate data set constituted by a combination of intermediate condition data of components when 200 substrates are plated and the processable number 300, an intermediate data set constituted by a combination of intermediate condition data of components when 300 substrates are plated and the processable number 200, and an intermediate data set constituted by a combination of intermediate condition data of components when 400 substrates are plated and the processable number 100.

In step 8, the arithmetic system 110 generates training data including the defect data set described above and the plurality of intermediate data sets described above. In an embodiment, the training data may not include a defect data set. In this case, the training data includes only a plurality of intermediate data sets.

In step 9, the arithmetic system 110 constructs a prediction model constituted by a neural network using the training data. More specifically, the arithmetic system 110 optimizes parameters of the prediction model (weights, etc.) by deep learning using the training data. The defect condition data (e.g., image data of a discolored seal holder 62) is input to the input layer 201 of the prediction model. The arithmetic system 110 determines the optimal parameter of the prediction model that may minimize a difference between the output value from the output layer 203 and 0. Similarly, intermediate condition data is input to the input layer 201 of the prediction model. The arithmetic system 110 determines the optimal parameter of the prediction model that may minimize a difference between the output value from the output layer 203 and the processable number (e.g., 300). In this way, the arithmetic system 110 performs deep learning using the training data and optimizes the parameters of the prediction model. The prediction model constructed by deep learning is stored in the storage device 110a of the arithmetic system 110.

Before inputting the defect condition data and the intermediate condition data to the prediction model, the defect condition data and the intermediate condition data may be pre-processed. Specifically, the arithmetic system 110 reduces the capacity of the defect condition data and the intermediate condition data by deleting a part of the defect condition data and a part of the intermediate condition data that do not contribute to a prediction of the number of substrates that may be processed. For example, since the seals 66 and 68 are annular, the arithmetic system 110 deletes the image data of the area inside the seals 66 and 68 from the image data sent from the imaging device 101. By such pre-processing, the capacity of the defect condition data and the intermediate condition data may be reduced, and the load on the arithmetic system 110 and the learning speed may be improved.

All processes from step 1 to step 9 are repeated a plurality of times, and the prediction model is updated using new training data. That is, a new substrate holder (e.g., another substrate holder having the same structure as the substrate holder 18 or a maintained substrate holder 18) is prepared, and a plurality of substrates are plated using the new substrate holder until a failure occurs in the new substrate holder. The arithmetic system 110 generates new training data and updates the prediction model by further optimizing the parameters of the prediction model. The component that has caused the failure of the new substrate holder is the same as the component that has caused the failure of the substrate holder 18 previously used for substrate plating. The types of defect condition data and intermediate condition data included in the new training data are also the same as the types of defect condition data and intermediate condition data included in the previously generated training data.

Similarly, a plurality of prediction models corresponding to a plurality of components of the substrate holder that may cause a failure are constructed. Specifically, a plurality of pieces of training data are generated using a plurality of substrate holders having the same structure, and parameters of a plurality of prediction models are optimized using the plurality of pieces of training data. The arithmetic system 110 stores the prediction models in the storage device 110a. A plurality of prediction models may be constructed by the number of circles (O) and triangles (Δ) in the table illustrated in FIG. 6. In an embodiment, only one prediction model may be constructed.

The plating apparatus illustrated in FIG. 1 plates a substrate using another substrate holder having the same structure as the substrate holder 18 used to construct the prediction model. Before plating the substrate, the imaging device 101 and the three-dimensional measuring device 102 generate image data and surface shape data of each component of the substrate holder, and the energization inspection device 118 measures the internal resistance of the substrate holder. The image data and the surface shape data are sent to the arithmetic system 110 and stored in the storage device 110a.

The arithmetic system 110 predicts the number of substrates that may be plated by using all the generated prediction models (learned models) until a failure occurs in the substrate holder currently used by the plating apparatus. That is, the arithmetic system 110 inputs the latest condition data representing the state of each component of the substrate holder that is currently used to all prediction models. The latest condition data is constituted by image data or surface shape data of each component of the substrate holder currently used. Each prediction model outputs the number of substrates that may be plated until a failure occurs in the substrate holder currently used by the plating apparatus, that is, the number of predictable substrates.

In the present embodiment, since the arithmetic system 110 determines the number of predictable substrates using all prediction models, the obtained plurality of predictable substrates may vary. Therefore, the arithmetic system 110 selects the smallest predictable number from a plurality of number of predictable substrates.

In the plating apparatus, a plurality of substrate holders having the same structure are used. An electronic tag to which a radio frequency identification (RFID) technique (see reference numeral "95" in FIG. 3) is applied is attached to each of the substrate holders. The electronic tag is called an RFID tag or an RF tag. The electronic tag includes an electric circuit, and information may be transmitted and received in a contactless manner with a reader and a writer (not illustrated). The identification number of the substrate holder to which the electronic tag is attached is written in advance in the electronic tag. The arithmetic system 110 transmits the predictable number (i.e., the smallest predictable number) to the writer, and the writer writes the predictable number in the electronic tag of the substrate holder.

As the substrate holder is used for substrate plating, the number of predictable substrates output from the prediction model decreases. Every time all prediction models output a plurality of predictable substrates, the arithmetic system 110 determines the smallest predictable number and transmits the smallest predictable number to the writer. The writer rewrites the predictable number already written in the electronic tag of the substrate holder.

The reader reads the predictable number from the electronic tag of the substrate holder, and displays the predictable number on a display (not illustrated). In this way, the user may know the number of substrates that may be predicted for each substrate holder. As a result, maintenance of each substrate holder may be performed at an appropriate timing.

Since the identification number of the substrate holder and the number of predictable substrates are written on the electronic tag, even after the substrate holder is taken out from the plating apparatus, the number of predictable substrates, which is stored in the arithmetic system 110 or the controller 115, is not referred to, and it is possible to know the number of predictable substrates unique to the substrate holder and the operation management of the substrate holder is facilitated.

The arithmetic system 110 includes, in addition to the above-described plurality of prediction models, a selection model which predicts a component that causes a failure of the substrate holder 18 from a plurality of components of the substrate holder 18 that may cause the failure of the substrate holder 18. The selection model is configured to calculate a certainty factor for each component. The certainty factor is an index value indicating the probability that each component causes a failure of the substrate holder 18, and is represented by a numerical value from 0 to 100. The certainty factor may be represented by a numerical value from 0 to 1. The certainty factor is sometimes called a score. The predictable number output from the prediction model constructed for the component with high certainty is a predictable number with high reliability.

Figure 9:
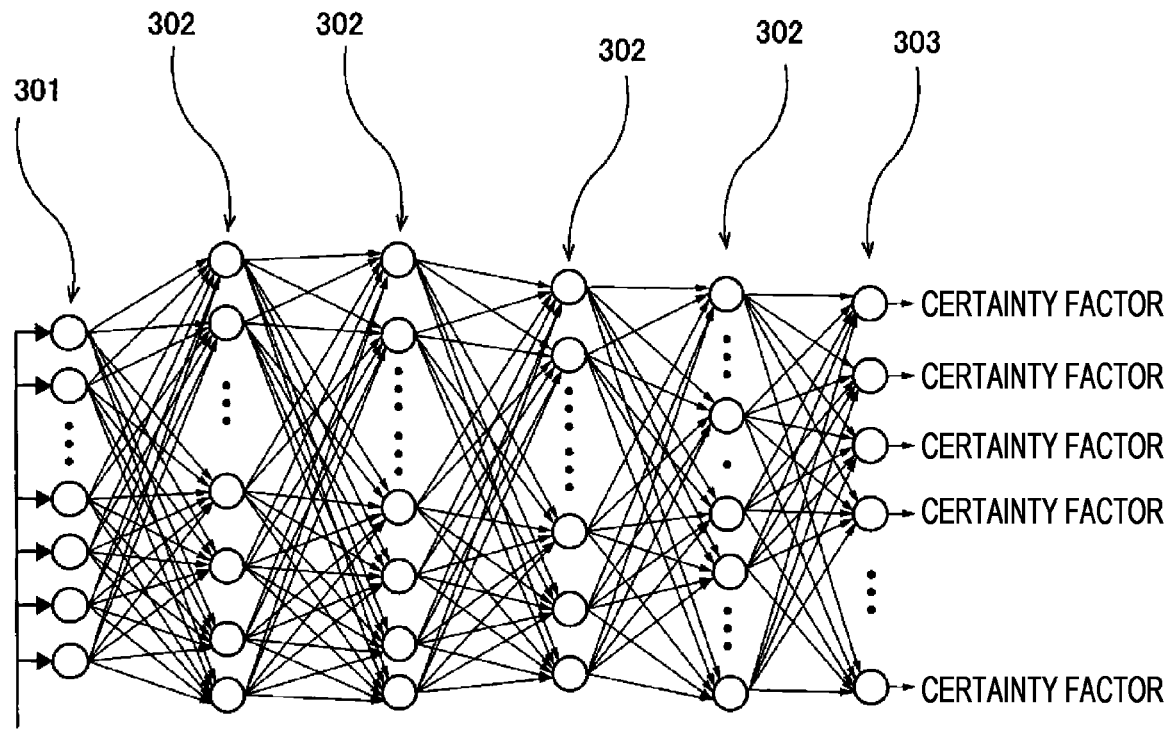
FIG. 9 is a schematic view illustrating an example of a selection model.

In the present embodiment, two selection models are provided corresponding to two types of failure of the substrate holder 18 (liquid leakage and poor energization). FIG. 9 is a schematic view illustrating an example of a selection model. As illustrated in FIG. 9, the selection model is a neural network having an input layer 301, a plurality of intermediate layers (also referred to as hidden layers) 302, and an output layer 303. The selection model illustrated in FIG. 9 includes four intermediate layers 302, but the configuration of the selection model is not limited to the example illustrated in FIG. 9.

Data representing the states of a plurality of components of the substrate holder 18 when a failure occurs in the substrate holder 18 is input to the input layer 301 of the selection model. In the present embodiment, the image data and the surface shape data of the seal holder 62, the first holding member 54, the first electrical contact 88, the second electrical contact 86, the external electrical contact 91, the seals 66 and 68, and the slide plate 64 illustrated in the table of FIG. 6, respectively, are input to the input layer 301 of the selection model. The output layer 303 of the selection model outputs a plurality of certainty factors corresponding to a plurality of components. The output layer 303 outputs the number of certainty factors which is equal to or greater than the number of components of the substrate holder 18 that may cause a failure of the substrate holder 18.

Figure 10:
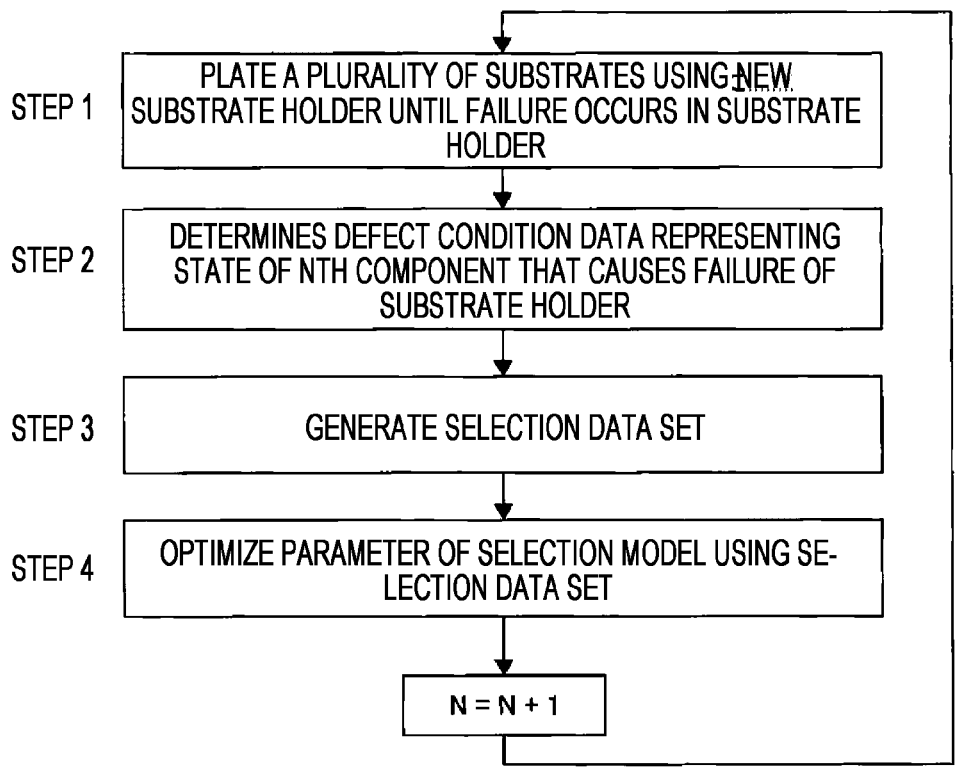
FIG. 10 is a flowchart illustrating an embodiment of a method for optimizing parameters of a selection model.

The arithmetic system 110 optimizes the parameters (weights, etc.) of the selection model by deep learning using training data, and constructs the selection model. FIG. 10 is a flowchart illustrating an embodiment of a method for optimizing parameters of a selection model.

In step 1, a plurality of substrates are plated using one new substrate holder 18. The plating of a plurality of substrates using the new substrate holder 18 is performed until a failure occurs in the substrate holder 18. Examples of the "new substrate holder 18" include not only unused substrate holders but also maintained substrate holders.

When a failure occurs in the substrate holder 18, the user takes out the substrate holder 18 from the plating apparatus, disassembles the substrate holder 18, and specifies the cause of the failure of the substrate holder 18. Further, the user gives to the arithmetic system 110 information that a failure has occurred in the substrate holder 18 due to a change in the state of the specified Nth component using an input device, a communication device, or the like (not illustrated). Specifically, the user teaches the arithmetic system 110 the Nth component to be used for the construction (learning) of the selection model. The Nth component is any one of a plurality of components that may cause a failure of the substrate holder 18. In the example illustrated in FIG. 6, the Nth component is any one of the seal holder 62, the first holding member 54, the first electrical contact 88, the second electrical contact 86, the external electrical contact 91, the seals 66 and 68, and the slide plate 64. For example, when the failure of the substrate holder 18 occurs due to deformation of the first electrical contact 88, the user gives to the arithmetic system 110 information that the component to be used for the construction (learning) of the selection model is the first electrical contact 88.

In step 2, the arithmetic system 110 determines defect condition data representing the state of the Nth component that causes the failure of the substrate holder 18. More specifically, the defect condition data is condition data representing the state of the Nth component when the failure occurs in the substrate holder 18. The defect condition data includes any one of the image data and the surface shape data of the Nth component.

In step 3, the arithmetic system 110 generates a selection data set including a numerical value set indicating that the cause of the failure of the substrate holder 18 is the Nth component, reference condition data representing the state of other components of the substrate holder 18 when the failure of the substrate holder 18 occurs, and the defect condition data. The other components of the substrate holder 18 may cause a failure of the substrate holder 18 and are components other than the Nth component.

The numerical value set indicating that the cause of the failure of the substrate holder 18 is the Nth component is a combination of 100 and 0 indicating the certainty factor. The numerical value set is a numerical value set representing a certainty factor that the user investigates the substrate holder in which the failure occurs in step 1 and determines that the change has been caused by the state change of the Nth component. Specifically, the numerical value corresponding to the Nth component specified as the cause of the failure is 100, and the numerical values corresponding to the other components are all 0o.

A plurality of components may cause a failure. Therefore, in an embodiment, the numerical value corresponding to each of the two or more components may be 100. When it is not possible to determine that the cause of the failure is in the Nth component, the numerical value corresponding to the Nth component may be a number smaller than 100. For example, when there is a high possibility that the cause of the failure of the substrate holder 18 is in the Nth component, but it cannot be determined, the numerical value corresponding to the Nth component may be 80.

In the example illustrated in FIG. 6, examples of the components that may cause the failure of the substrate holder 18 include the seal holder 62, the first holding member 54, the first electrical contact 88, the second electrical contact 86, the external electrical contact 91, the seal 66 and 68, and the slide plate 64. For example, when the Nth component is the seal holder 62, the other components include the first holding member 54, the first electrical contact 88, the second electrical contact 86, the external electrical contact 91, the seals 66 and 68, and the slide plate 64. Therefore, the reference condition data of the other components is reference condition data representing the states of the first holding member 54, the first electrical contact 88, the second electrical contact 86, the external electrical contact 91, the seals 66 and 68, and the slide plate 64. The reference condition data includes at least one of the image data and the surface shape data of each of the other components.

In step 4, the arithmetic system 110 optimizes the parameters (weights, etc.) of the selection model illustrated in FIG. 9 by deep learning using the selection data set generated in step 3 above. Specifically, the defect condition data and the reference condition data are input to the input layer 301 of the selection model. For example, in a case where the seal holder 62 is discolored when a failure occurs in the substrate holder 18, image data of the seal holder 62 is input to the input layer 301 as defect condition data, and the image data and the surface shape data of the components other than the seal holder 62 are input to the input layer 301 as reference condition data. The arithmetic system 110 determines the optimal parameter of the selection model that may minimize a difference between the output value set from the output layer 303 and the numerical value set generated in step 3 above.

The processes from step 1 to step 4 in FIG. 10 are repeated until a selection data set is generated for all of the plurality of components of the substrate holder 18 that may cause a failure of the substrate holder 18, and the parameters of the selection model are optimized using all the generated selection data sets. That is, a new substrate holder (e.g., another substrate holder having the same structure as that of the substrate holder 18 or a maintained substrate holder 18) is prepared, and a plurality of substrates are plated using the new substrate holder until a failure occurs in the new substrate holder due to a component different from the Nth component. The arithmetic system 110 generates a new selection data set and further optimizes the parameters of the selection model. The initial value of N illustrated in FIG. 10 is 1, and N=N+1 indicates that a component having the substrate holder is changed to another component. In the embodiment illustrated in FIG. 6, a selection data set is generated for all of the seal holder 62, the first holding member 54, the first electrical contact 88, the second electrical contact 86, the external electrical contact 91, the seals 66 and 68, and the slide plate 64, and the processes from step 1 to step 4 are repeated until the parameters of the selection model are optimized using all of the generated selection data sets. In this way, a selection model which may predict a component that causes a failure of the substrate holder 18 is constructed. The constructed selection model is stored in the storage device 110a of the arithmetic system 110. Meanwhile, FIG. 10 conceptually illustrates that a selection data set corresponding to a component of the substrate holder 18 that may cause a failure and learning using the selection data set (optimization of the model) are necessary. Actually, in order to perform a prediction with high accuracy, it is necessary to repeatedly perform a learning using a sufficient amount of selection data sets for one component.

The plating apparatus illustrated in FIG. 1 plates a substrate using a substrate holder having the same structure as the substrate holder 18 used for the construction of the prediction model and the selection model. Before plating the substrate, the imaging device 101 and the three-dimensional measuring device 102 generate image data and surface shape data of each component of the substrate holder, and the energization inspection device 118 measures the internal resistance of the substrate holder. The image data and the surface shape data are sent to the arithmetic system 110 and stored in the storage device 110a.

The arithmetic system 110 inputs all the latest condition data representing the respective states of the plurality of components of the substrate holder currently used by the plating apparatus to the input layer 301 of the selection model. Each of the latest condition data is constituted by the image data or the surface shape data of each component of the substrate holder currently used. In the example illustrated in FIG. 6, the image data and the surface shape data of all the components are input to the input layer 301 of the selection model. The selection model outputs a plurality of certainty factors corresponding to a plurality of components.

The arithmetic system 110 selects at least one component based on the plurality of certainty factors output from the selection model. Basically, the component with the highest certainty is selected.

The arithmetic system 110 stores a reference value in the storage device 110a, and selects all the components having a certainty factor greater than the reference value. In the following example, component A and component B are selected.

Reference value: 65%
Component A: certainty factor of 80%
Component B: certainty factor of 70%
Component C: certainty factor of 10%
Component D: certainty factor of 5%
Component E: certainty factor of 1%

In the above example, when the reference value is 85%, all the components are not selected. In this case, the upper M components are selected (M is a natural number smaller than the total number of all components). Alternatively, when the difference between the certainty factor of the upper K-th component and the certainty factor of the upper K+1-th component is larger than a preset value, the upper K components are selected (K is a natural number smaller than M). For example, in the above example, when the preset value is 40%, since the difference between the certainty factor of component B and the certainty factor of component C is 60%, component A and component B are selected.

The arithmetic system 110 uses the prediction model constructed for at least one selected component to calculate the predicted number of substrates that may be plated until a failure occurs in the substrate holder currently used by the plating apparatus. That is, the arithmetic system 110 inputs the image data and the surface shape data to a prediction model constructed for at least one selected component. The prediction model outputs the predicted number of substrates that may be plated until a failure occurs in the substrate holder, that is, the number of predictable substrates. When a plurality of components are selected, the plurality of prediction models corresponding to the plurality of components respectively output the number of predictable substrates.

The arithmetic system 110 selects the smallest predictable number among the plurality of number of predictable substrates.

In calculating the number of predictable substrates using only the prediction model described above, it is not possible to know which component ultimately causes a failure in the substrate holder being used, so that it is necessary to input the latest condition corresponding to each component to the prediction model corresponding to each component. Meanwhile, in calculating the number of predictable substrates using the selection model and the prediction model described above, all of the latest condition data representing the respective states of the plurality of components of the substrate holder currently used by the plating apparatus is first input to the input layer 301 of the selection model. The certainty factor output from the output layer of the selection model may vary for each component. That is, the certainty factor corresponding to the component that has a sign causing the failure is high, and the certainty factor corresponding to the component member that has no sign causing the failure is low. In this way, since it is possible to predict the component that may cause the failure of the substrate holder by using the selection model, the number of predictable substrates may be calculated using only the latest condition data and the prediction model corresponding to the component. In an embodiment, the reference value described above may be set to be low at the initial stage of use of the substrate holder, and may be set to increase as the number of processed substrate holders increases.

In an embodiment, the arithmetic system 110 may include a first server (first computer) and a second server (second computer). The storage device 110a and the processing device 110b of the arithmetic system 110 are constituted by a first storage device and a first processing device in the first server, and a second storage device and a second processing device in the second server. For example, the construction and update of the prediction model and the selection model described above may be executed by the first server, and the calculation of the number of predictable substrates and the calculation of the certainty factor using the prediction model and the selection model may be executed by the second server.

In an embodiment, the prediction model and the selection model may be constructed in advance in a system different from the arithmetic system 110 (a server or a computer), the constructed prediction model and selection model may be installed in the arithmetic system 110, and only the calculation of the number of predictable substrates and the calculation of the certainty factor using the prediction model and the selection model may be executed by the arithmetic system 110.

Figure 11:
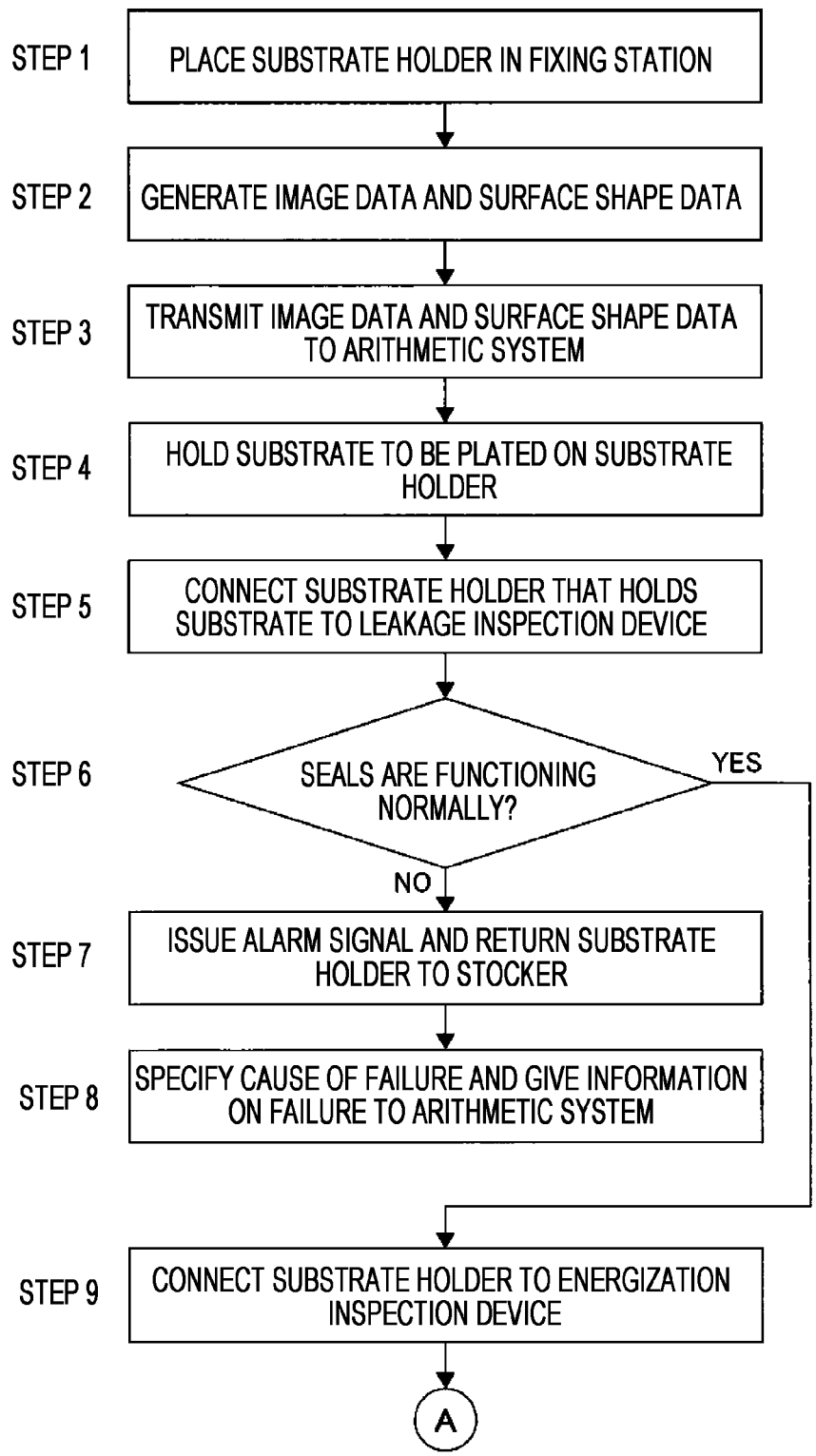
FIG. 11 is a flowchart illustrating an embodiment of a process for determining whether a substrate holder may be used.
Figure 12:
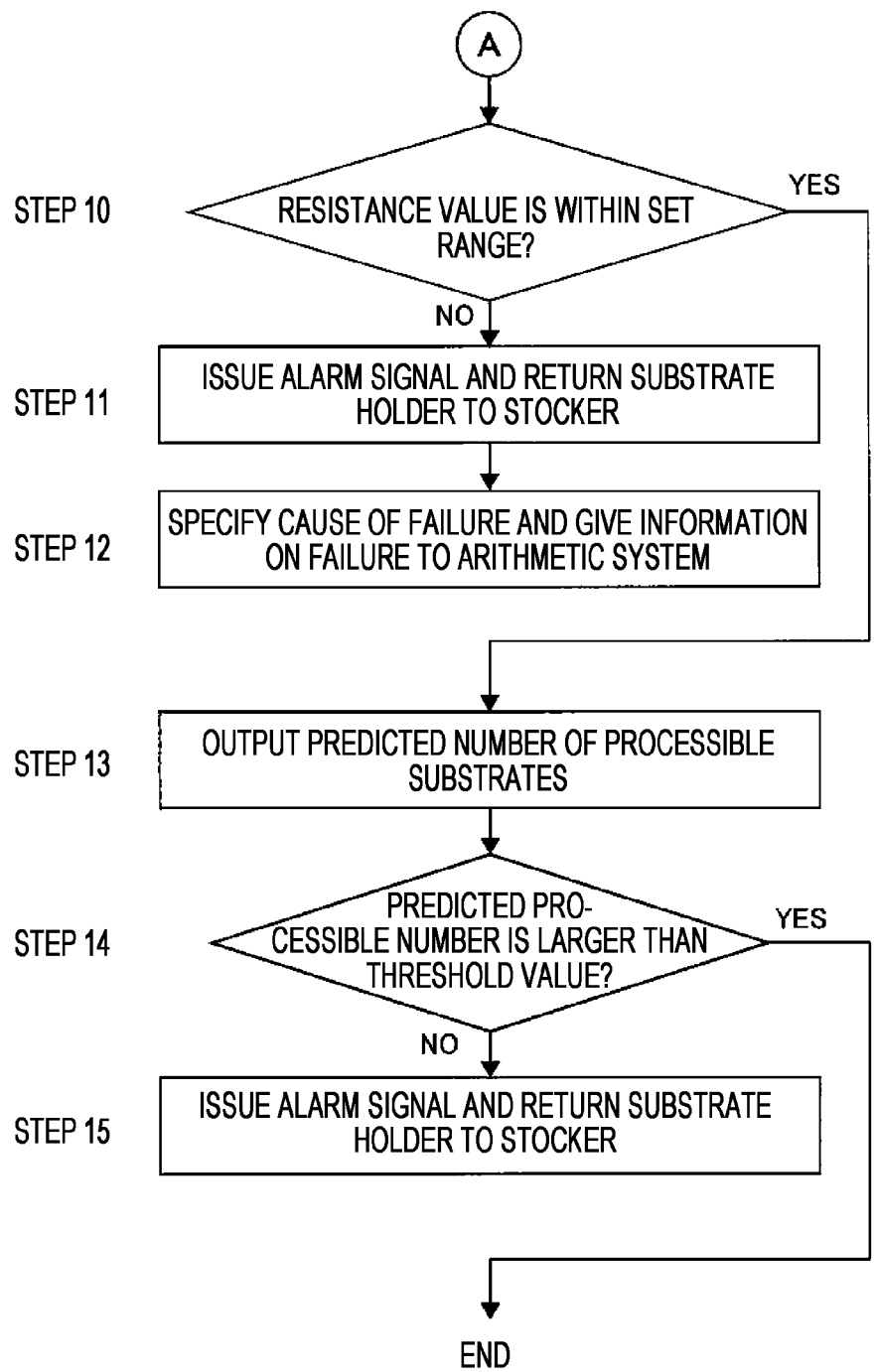
FIG. 12 is a flowchart illustrating an embodiment of a process for determining whether a substrate holder may be used.

Next, with reference to the flowcharts illustrated in FIGS. 11 and 12, descriptions will be made on an embodiment of a process of determining whether the substrate holder 18 mounted on the plating apparatus may be used. In step 1, the substrate holder 18 accommodated in the stocker 24 is gripped by the first transporter 42 of the substrate holder transport device 40 and transported to the fixing station 20. Then, the substrate holder 18 is lowered to a horizontal state, whereby the substrate holder 18 is placed on the mounting plate 52 of the fixing station 20.

In step 2, the air cylinder of the fixing station 20 is operated to open the second holding member 58 of the substrate holder 18, and the image data and the surface shape data of each component of the substrate holder 18 are photographed by the imaging device 101 and the three-dimensional measuring device 102, respectively.

Figure 13A:
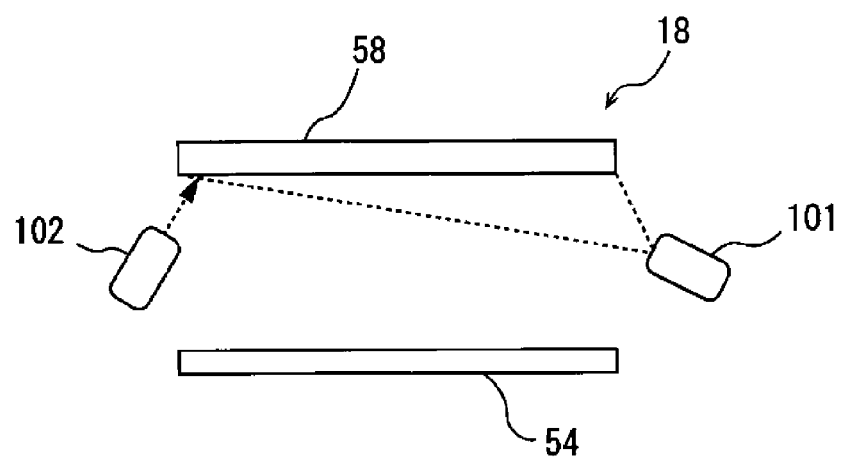
FIGS. 13A and 13B are schematic views illustrating an example of a method of photographing a component of a substrate holder and a method of measuring a surface shape.
Figure 13B:
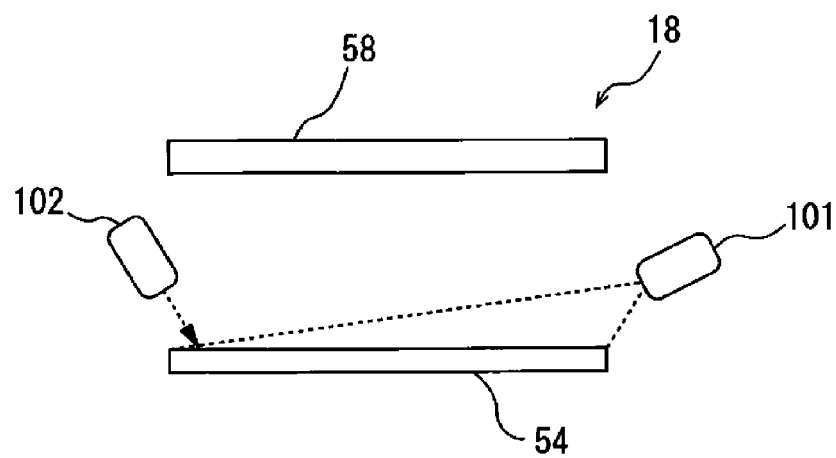

FIG. 13A and FIG. 13B are schematic views illustrating an example of an imaging method of a component of the substrate holder 18 and a surface shape measurement method. FIG. 13A is a schematic view illustrating an example of an imaging method and a surface shape measurement method of the seal holder 62, the first electrical contact 88, the seal 66, and the seal 68. FIG. 13B is a schematic view illustrating an example of an imaging method and a surface shape measurement method of the first holding member 54 and the second electrical contact 86. The imaging device 101 photographs a plurality of components of the substrate holder 18 and generates image data of each component. The three-dimensional measuring device 102 measures the surface shape of a plurality of components of the substrate holder 18 and generates the surface shape data of each component.

Referring back to FIG. 11, in step 3, the imaging device 101 and the three-dimensional measuring device 102 transmit the image data and the surface shape data generated in step 2 to the arithmetic system 110. In step 4, the controller 115 issues a command to the fixing station 20 to hold the substrate to be plated on the substrate holder 18. Thereafter, the substrate holder 18 is connected to the leakage inspection device 117 (step 5).

In step 6, the leakage inspection device 117 inspects whether the seals 66 and 68 of the substrate holder 18 are functioning normally. The leakage inspection device 117 forms a positive pressure or a negative pressure in the internal space R1 provided in the substrate holder 18 by the seals 66 and 68, and issues an alarm signal indicating that a failure has occurred in the substrate holder 18 when the pressure in the internal space R1 (a positive pressure or a negative pressure) exceeds allowable values within a predetermined time. The alarm signal is transmitted to the controller 115. Upon receiving the alarm signal, the controller 115 issues a command to the substrate holder transport device 40, grips the substrate holder 18 with the first transporter 42 of the substrate holder transport device 40, and returns the substrate holder 18 to a predetermined location of the stocker 24 (step 7).

When the leakage inspection device 117 generates an alarm signal, the user may execute step 8. In step 8, the user may take out the substrate holder 18 from the plating apparatus, disassemble the substrate holder 18, and specify the cause of the failure of the substrate holder 18. Further, the user may give to the arithmetic system 110 information indicating that a failure has occurred in the substrate holder 18 due to a change in the state of the specified component using an input device, a communication device, or the like (not illustrated). That is, the user may teach the arithmetic system 110 the components to be used for the construction (learning) of the prediction model.

When the seals 66 and 68 of the substrate holder 18 are functioning normally, the substrate holder 18 is connected to the energization inspection device 118 while holding the substrate to be plated (step 9). In step 10, the energization inspection device 118 measures the internal resistance of the substrate holder 18 and compares the measured resistance value with a predetermined setting range. When the measured resistance value is out of the setting range, the energization inspection device 118 issues an alarm signal indicating that a failure has occurred in the substrate holder 18. The alarm signal is transmitted to the controller 115. Upon receiving the alarm signal, the controller 115 issues a command to the substrate holder transport device 40, grips the substrate holder 18 with the first transporter 42 of the substrate holder transport device 40, and returns the substrate holder 18 to a predetermined location of the stocker 24 (step 11).

When the energization inspection device 118 generates an alarm signal, the user may execute step 12. In step 12, the user may take out the substrate holder 18 from the plating apparatus, disassemble the substrate holder 18, and specify the cause of the failure of the substrate holder 18. Further, the user may give to the arithmetic system 110 information indicating that a failure has occurred in the substrate holder 18 due to a change in the state of the specified component using an input device, a communication device, or the like (not illustrated). That is, the user may teach the arithmetic system 110 the components to be used for the construction (learning) of the prediction model.

When the resistance value measured in step 10 is within the setting range, the arithmetic system 110 inputs each data transmitted in step 3 to the prediction model, and outputs the number of predictable substrates (step 13).

In step 14, the arithmetic system 110 compares the predictable number output in step 12 with a predetermined threshold value. When the predictable number is larger than the threshold value, the arithmetic system 110 terminates a process of determining whether the substrate holder 18 may be used, and transmits a use permission signal to the controller 115. The controller 115 causes the plating apparatus to execute a plating process (to be described later).

When the number of predictable substrates is smaller than the threshold value, the arithmetic system 110 issues an alarm signal indicating that maintenance of the substrate holder 18 is necessary. The alarm signal is transmitted to at least the controller 115. Upon receiving the alarm signal, the controller 115 issues a command to the substrate holder transport device 40, grips the substrate holder 18 with the first transporter 42 of the substrate holder transport device 40, and returns the substrate holder 18 to a predetermined location of the stocker 24 (step 15).

Hereinafter, an embodiment of the plating process will be described. The substrate is held by the substrate holder 18 in a state where the surface to be plated is exposed from an opening 58a of the substrate holder 18. The substrate is electrically connected to the plurality of first electrical contacts 88 at a portion not touching the plating solution. The external electrical contact 91 of each substrate holder 18 contacts a power supply electrode (not illustrated) disposed on the edge of each plating cell 38. The power supply electrode is electrically connected to a conductive film such as a seed layer of the substrate through the external electrical contact 91, the electric wire 92, the second electrical contact 86, and the first electrical contact 88. The power supply electrode is electrically connected to a power source (not illustrated).

After suspending the substrate holder 18 in the plating cell 38 filled with the plating solution, a plating voltage is applied between the anode in the plating cell 38 (not illustrated) and the substrate, so that the surface of the substrate is plated. After the plating is finished, the substrate holder 18 is transported to the second water washing tank 30b, and the surface of the substrate is washed. After the substrate washing, the substrate and substrate holder 18 are dried in the blow tank 32. The first transporter 42 of the substrate holder transport device 40 grips the dried substrate holder 18 and places the substrate holder 18 on the mounting plate 52 of the fixing station 20. The dried substrate is taken out from the substrate holder 18 and returned to a cassette 10.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of constructing a prediction model for predicting a number of plateable substrates, the method comprising:
    plating a plurality of substrates using a substrate holder;
    determining a total number of substrates that have been plated using the substrate holder until a failure occurs in the substrate holder;
    determining a first processable number and a second processable number which are numbers of substrates that are plateable until the failure occurs in the substrate holder;
    generating a first data set constituted by a combination of the first processable number and first condition data corresponding to the first processable number and representing a state of a component of the substrate holder;
    generating a second data set constituted by a combination of the second processable number and second condition data corresponding to the second processable number and representing the state of the component; and
    optimizing a parameter of a prediction model constituted by a neural network using training data including the first data set and the second data set.

2. The method according to claim 1, wherein the first processable number is 0,
    the first condition data is defect condition data representing the state of the component of the substrate holder when the failure occurs, and
    the first data set is a defect data set constituted by a combination of the defect condition data and 0.

3. The method according to claim 2, wherein the second processable number is a processable number obtained by subtracting an intermediate number smaller than the total number from the total number,
    the second condition data is intermediate condition data representing a state of the component when plating the intermediate number of substrates, and
    the second data set is an intermediate data set constituted by a combination of the intermediate condition data and the second processable number.

4. The method according to claim 1, wherein the first processable number is a processable number obtained by subtracting a first intermediate number smaller than the total number from the total number,
    the first condition data is first intermediate condition data representing a state of the component when plating the first intermediate number of substrates,
    the first data set is a first intermediate data set constituted by a combination of the first intermediate condition data and the first processable number,
    the second processable number is a processable number obtained by subtracting a second intermediate number smaller than the first intermediate number from the total number,
    the second condition data is second intermediate condition data representing a state of the component when plating the second intermediate number of substrates, and the second data set is a second intermediate data set constituted by a combination of the second intermediate condition data and the second processable number.

5. The method according to claim 1, wherein each of the first condition data and the second condition data includes any one of image data and surface shape data of the substrate holder.

6. The method according to claim 1, wherein the prediction model includes a neural network having an input layer, at least two intermediate layers, and an output layer.

7. The method according to claim 1, wherein the prediction model is updated by repeating steps of the plating the plurality of substrates, the determining the total number of substrates, the determining the first processable number and the second processable number, the generating the first data set, the generating the second data set, and the optimizing the parameter of the prediction model.

8. The method according to claim 1, further comprising:
generating a selection data set including a numerical value set indicating that a cause of the failure of the substrate holder is in the component, reference condition data representing a state of other component of the substrate holder when the failure occurs, and defect condition data representing the state of the other component when the failure occurs; and
optimizing a parameter of a selection model constituted by a neural network, using the selection data set.

9. A method of constructing a prediction model comprising:
preparing the prediction model using the method according to claim 1;
inputting latest condition data representing a state of a component of a currently used substrate holder to the prediction model; and
outputting a predicable number of substrates from the prediction model.

10. The method according to claim 9, further comprising:
writing the predicable number on an electronic tag attached to the currently used substrate holder.

11. A method of constructing a selection model for predicting a component that causes a failure of a substrate holder from a plurality of components of the substrate holder, the method comprising:
plating a plurality of substrates until the failure occurs in a first substrate holder due to a first component of the first substrate holder;
generating a first selection data set including a first numerical value set indicating that a cause of the failure of the first substrate holder is the first component, first reference condition data representing a state of a second component of the first substrate holder when the failure occurs, and first defect condition data representing a state of the first component when the failure occurs;
optimizing a parameter of a selection model constituted by a neural network, using the first selection data set;
plating the plurality of substrates until a failure occurs in a second substrate holder due to the second component of the second substrate holder;
generating a second selection data set including a second numerical value set indicating that a cause of the failure of the second substrate holder is the second component, second reference condition data representing a state of a first component of the second substrate holder when the failure occurs, and second defect condition data representing a state of the second component when the failure occurs; and
further optimizing the parameter using the second selection data set.

12. The method according to claim 11, wherein each of the first reference condition data and the first defect condition data is constituted by any one of image data and surface shape data of the first substrate holder, and each of the second reference condition data and the second defect condition data is constituted by any one of image data and surface shape data of the second substrate holder.

13. A method comprising: inputting latest condition data of a first component and a second component of a substrate holder representing a state of components of a currently used substrate holder to the selection model constructed by the method according to claim 11; when a first certainty factor corresponding to a first component output from the selection model is higher than a second certainty factor corresponding to the second component, inputting the latest condition data of the first component to a prediction model corresponding to the first component; and outputting a predictable number of substrates of the substrate holder from the prediction model, wherein the prediction model is a prediction model constructed by the method according to claim 1.

* * * * *